(12) United States Patent
Higashi et al.

(10) Patent No.: US 8,952,536 B2
(45) Date of Patent: Feb. 10, 2015

(54) SEMICONDUCTOR DEVICE AND METHOD OF FABRICATION

(75) Inventors: Masahiko Higashi, Aizuwakamatsu (JP); Hiroyuki Nansei, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 320 days.

(21) Appl. No.: 12/199,690

(22) Filed: Aug. 27, 2008

(65) Prior Publication Data

US 2009/0085213 A1    Apr. 2, 2009

Related U.S. Application Data

(60) Division of application No. 11/237,591, filed on Sep. 27, 2005, now Pat. No. 7,479,427, which is a continuation of application No. PCT/JP2004/014254, filed on Sep. 29, 2004.

(51) Int. Cl.
| | |
|---|---|
| *H01L 23/52* | (2006.01) |
| *H01L 27/105* | (2006.01) |
| *H01L 21/265* | (2006.01) |
| *H01L 27/115* | (2006.01) |

(52) U.S. Cl.
CPC ........ *H01L 27/105* (2013.01); *H01L 21/26586* (2013.01); *H01L 27/11568* (2013.01); *H01L 27/11534* (2013.01)
USPC ............... 257/754; 257/301; 257/E23.141

(58) Field of Classification Search
USPC .................... 257/301, 754, E23.141
See application file for complete search history.

(56) References Cited

U.S. PATENT DOCUMENTS

| | | | |
|---|---|---|---|
| 5,168,334 A | 12/1992 | Mitchell et al. | |
| 5,420,060 A | 5/1995 | Gill et al. | |
| 5,900,529 A * | 5/1999 | Hanisko et al. | ................. 73/1.38 |
| 5,966,603 A | 10/1999 | Eitan | |
| 5,990,529 A | 11/1999 | Shin | |
| 6,153,471 A * | 11/2000 | Lee et al. | ....................... 438/263 |
| 6,297,096 B1 | 10/2001 | Boaz | |
| 6,541,816 B2 | 4/2003 | Ramsbey et al. | |
| 2001/0024857 A1 | 9/2001 | Parat et al. | |

FOREIGN PATENT DOCUMENTS

| | | |
|---|---|---|
| JP | 1152673 | 6/1989 |
| JP | 2000360 | 1/1990 |
| JP | 02-000360 A | 5/1990 |
| JP | 04054627 | 3/1992 |
| JP | 04-209573 A | 7/1992 |
| JP | 4209573 | 7/1992 |
| JP | 08348076 | 12/1996 |
| JP | 10-223867 A | 8/1998 |
| JP | 2000-091545 A | 3/2000 |
| JP | 2001-077220 | 3/2001 |
| JP | 2003-133447 A | 5/2003 |
| JP | 2003-152116 A | 5/2003 |
| JP | 2004247592 | 9/2004 |

* cited by examiner

*Primary Examiner* — Long Pham

(57) ABSTRACT

A semiconductor memory device employs a SONOS type memory architecture and includes a bit line diffusion layer in a shallow trench groove in which a conductive film is buried. This makes it possible to decrease the resistivity of the bit line diffusion layer without enlarging the area on the main surface of the semiconductor substrate, and to fabricate the semiconductor memory device having stable electric characteristics without enlarging the cell area. The bit line is formed by implanting ions into the sidewall of $Si_3N_4$.

12 Claims, 15 Drawing Sheets

A-A'

B-B'

C-C'

D-D'

SEMICONDUCTOR DEVICE AND METHOD OF FABRICATION

CROSS-REFERENCES TO RELATED APPLICATIONS

This is a divisional continuing application of U.S. patent application Ser. No. 11/237,591 filed Sep. 27, 2005, now U.S. Pat. No. 7,479,427 which was a continuation of International Application No. PCT/JP2004/014254, filed Sep. 29, 2004, the International Application not published in English under PCT Article 21(2).

FIELD OF THE INVENTION

This invention generally relates to semiconductors and methods for fabricating the same, and more particularly, to a semiconductor device having a gate insulating film that stores charge therein to retain data and to a method for fabricating the same.

BACKGROUND OF THE INVENTION

Non-volatile memories, in which the data is rewritable, are now widely used. In the technical field of non-volatile memories, techniques for increasing the number of bits per unit area and reducing the cost per bit have been developed.

A non-volatile flash memory generally employs a floating-gate flash memory having an array architecture such as of a NOR type or NAND type. A NOR-type floating-gate flash memory has a random access feature, yet it is difficult to increase the density thereof, because a bit line contact has to be provided in each cell. On the other hand, in a NAND-type floating-gate flash memory, the cells can be connected in series to reduce the number of the bit line contacts, enabling high-density cell arrangement, yet the cells cannot be accessed randomly. In addition, it is not easy to reduce the thickness of the tunnel insulating film in a floating-gate flash memory. This is a technical drawback in increasing the capacity of the memory.

In order to deal with the above-mentioned drawbacks, there is a well-known method of changing the threshold value of a floating-gate flash memory, according to the quantity of electric charge for storing multi-level data in one cell. In a memory cell of this type, at least one portion of the gate insulating film is made with a material having electron-trapping properties so that a change in the threshold value of a cell-transistor can be read by controlling the quantity of electric charge trapped in the aforementioned one portion. In contrast, a normal floating-gate flash memory spatially stores the charge uniformly in the floating gate so that the change in the threshold value can be read by controlling the quantity of the stored charge. Specifically, the gate insulating film provided immediately below the gate electrode is configured to have an ON structure or ONO stack. The charge is partially stored in a $Si_3N_4$ film provided near the source/drain of the transistor. This makes it possible to store two-bit data in one cell. A SONOS type memory having buried bit lines is known as the aforementioned type of memory. The stored charge is not necessarily provided uniformly in terms of space in the insulating film. Instead, its non-uniformity is due to the non-uniform injection of charge.

When the SONOS type memory cell architecture having buried bit lines is compared to the floating-gate memory cell having buried bit lines, the method of retaining the electric charge is different. In addition, there is another difference in that the SONOS type memory having buried bit lines employs source lines and bit lines that operate in the same manner, although both types have memory cells with buried bit lines. Here, the bit line serves as the source or drain in each cell in the SONOS type memory having buried bit lines. Hence, in the following description, the bit line shall also denote the source and drain of the cell.

The above-mentioned SONOS type memory having buried bit lines has a simple architecture compared to that of the floating-gate memory cell and can be accessed randomly. Moreover, the array thereof has a contactless structure. Two-bit information can be stored in one cell, and accordingly high-density information can be stored (the cell area can be downsized by approximately ½). SONOS type memories having buried lines are extremely useful devices in industry. The buried bit line structure denotes an array structure of the NOR type memory, yet does not require a bit line contact window in each transistor because a source/drain diffusion layer serves as the bit line of the SONOS type memory below a word line.

FIGS. 1A through 1H are cross-sectional views illustrating a conventional fabrication process for forming a multi-level cell of the SONOS type having buried bit lines. It comprises a semiconductor substrate 100, an insulating film such as a nitride film 101, well regions 102 and 103, a trench groove 110 for element isolation, an insulating film 111 for element isolation, a resist pattern 112 for forming element isolation, a tunnel insulating film 121, a nitride film 122 for storage, an upper oxide film 123 of an ONO stack, a diffusion layer bit line 124, gate oxide films 131 and 132, a gate electrode 151, a contact hole 161, and wiring 162. In this conventional example, shallow trench isolation (STI) is employed for element isolation in a peripheral circuit. In addition, a memory cell array region (core region) has a planar structure. On the other hand, the periphery circuit has a CMOS structure, and the core region and the peripheral circuit region have different structures.

Referring to FIG. 1A, the insulating film 101 is formed on a main surface of semiconductor substrate 100, and a resist pattern 112 is formed on insulating film 101 using photolithography techniques. Etching techniques provide trench grooves 110 for element isolation. For example, substrate 100 is a p-type semiconductor. The $Si_3N_4$ film is grown to a thickness of approximately 100 nm and serves as the insulating film 101. The resist is applied to pattern the film. Resist pattern 112 is used as a mask for element isolation in order to etch certain portions of the $Si_3N_4$ film and the semiconductor substrate to form trench groove 110 having a depth of approximately 350 nm.

Next, resist pattern 112 is removed, and a buried insulating film is grown on the main surface of semiconductor substrate 100. A CMP process is carried out to expose insulating film 101. The aforementioned buried insulating film is polished and only remains inside the trench groove 110 to form the insulating film 111 for element isolation. After the insulating film 111 is formed, insulating film 101 is removed (FIG. 1B). For example, a HDP (high-density plasma) oxide film having the thickness of 550 nm is employed for the buried insulating film. The insulating film 101 of $Si_3N_4$ is removed by etching with phosphoric acid. Subsequently, the well regions 102 and 103 are formed in the peripheral circuit region by ion implantation (FIG. 1C). This process is performed in such a manner that, for example, the resist is applied and patterned and then ions of phosphor are implanted using the resist pattern as a mask. After phosphorous ions are implanted, boron ions may be implanted to form a triple well structure in well region 103.

Further, the tunnel insulating film 121, the nitride film 122 for storage, and the upper oxide film 123 are successively stacked to form the ONO stack. Openings are provided on given portions in the aforementioned ONO stack for forming the bit line of diffusion layer 124 using photolithography techniques. Ions are then implanted through openings to form the bit line of diffusion layer 124 (FIG. 1D). In this process, for example, a tunnel oxide film having the thickness of approximately 7 nm is formed by thermally oxidizing the main surface of semiconductor substrate 100, where the insulating film has been removed from the core region and the peripheral circuit region by HF. A nitride film having a thickness of approximately 10 nm is deposited on the tunnel oxide film using a CVD process. Moreover, the surface of the nitride film is thermally oxidized to form an upper oxide film having a thickness of approximately 10 nm. Thus, the ONO stack is formed in this manner. In addition, arsenic ions are implanted from the openings to create the bit line of the diffusion layer at a concentration of approximately $1.0 \times 10^{15}$ cm$^{-2}$ and an accelerating voltage of 50 KeV The above-mentioned ONO stack is formed not only in the core region, but also in the peripheral circuit region. The ONO stack is not needed in the peripheral circuit region. Thus, the ONO stack provided in the peripheral circuit region is removed using resist patterning techniques (FIG. 1E).

The gate insulating films 131 and 132, which are different in thickness, are formed in the periphery circuit by thermal oxidization (FIG. 1F). In order to form these gate insulating films 131 and 132, for example, a gate insulating film having a thickness of approximately 8 nm is first formed by a thermal process at approximately 900° C. The resist is patterned and removed using HF, and the thermal oxidization is again conducted at approximately 900° C. to form a thermally oxidized film having a thickness of approximately 10 nm. In this manner, it is possible to form the gate insulating films with two thicknesses; i.e., approximately 10 nm and 13 nm respectively.

After the aforementioned gate insulating films are formed, a conductive film is grown on the ONO stack and on the gate insulating film for the gate electrode. The resist is patterned and etched to form the word line and the gate electrodes 151 in the periphery circuit (FIG. 1G). This conductive film for the gate electrode is made, for example, of polysilicon having the thickness of approximately 180 nm, and is grown by a thermal CVD method. Finally, the source/drain regions are formed in the peripheral circuit region using resist patterning and ion implantation. A silicide may be formed, an interlayer insulating film may be grown, and the contact hole 161 and wiring 162 may be formed as necessary (FIG. 1H).

Following is a description of the operation of a conventional SONOS type cell-transistor in which one bit is contained per cell. That is, near the drain, hot electrons are generated during programming, and hot holes are generated by tunneling between bands during erasing. However, the electrons and holes are trapped in the gate insulating film. During reading, the source and drain are reversed and the difference in the threshold value is detected by the difference in the amount of positive and negative charge. In order to arrange the SONOS cells having one bit per cell at a high density, the above-mentioned architecture of buried bit lines is employed in the array. The bit line functions as the drain during programming and erasing, and functions as the source during reading. In the SONOS type planar memory cell with the buried bit lines, the ONO stack isolates the bit line of diffusion layer from the word line.

FIG. 2A is a schematic plan view of a SONOS type memory cell having buried bit lines. FIG. 2B through FIG. 2E show cross-sectional views taken along lines A-A', B-B', C-C', and D-D' respectively shown in FIG. 2A. The drawings, show a word line WL 201, a bit line BL 202, a bit line contact 203, and a gate insulating film 204. This SONOS type of memory cell is a NOR type. Generally, one bit line contact 203 is provided for multiple world lines (WL: 201). The bit lines (diffusion layer) 202 are arranged below the word lines 201 through the gate insulating film 204.

However, the width of the line 202 becomes narrower as the cell is downsized. Also, the concentration of ion implantation should be reduced to avoid short channeling. Thus, the resistivity of the bit line of diffusion layer 202 becomes higher. As a result, the number of contacts must be increased because if resistivity of the bit line of diffusion layer 202 becomes higher, there arises a difference in the effective voltage applied to cells connected to the word line 201 next to the bit line contacts 203 and the effective voltage applied to the cells respectively connected to the word lines 201. This is due to the voltage effect of the current flowing through the bit lines; (for example, during programming). This results in the different characteristics between the cells depending on their distance from the bit line contact 203.

Therefore, in order to downsize the memory cell, for example, a layout with the bit line contact 203 provided for every 16 word lines has to be changed to another layout with a bit line contact 203 for every eight word lines. However, the technical features of a small cell area will be impaired, although the small cell area is an advantage of SONOS type memory cell with buried bit lines. To solve this problem, it would be desirable to provide a method of reducing the resistivity of the bit line of diffusion layer 202 without increasing the planar surface area of the bit line on the substrate surface.

SUMMARY OF THE INVENTION

In view of the above, it is an object of the present invention to provide a cell of the SONOS structure having buried bit lines and a bit line of diffusion layer formed in a shallow trench so as to obtain stable electric characteristics without increasing cell area.

Another object of the present invention is to provide a fabrication method suitable for miniaturizing the non-volatile memory having buried bit lines and to provide a structure wherein misaligned contacts do not result in short circuits between the bit lines.

In particular, with respect to a SONOS type memory having buried bit lines, it is a further object to provide a technique for reducing the resistivity of the bit line by suppressing the extension of the bit line in the lateral direction caused by impurity diffusion in the bit line.

In order to solve the above-mentioned problems, there is provided a semiconductor device including a buried bit line structure having a groove in which a bit line is buried, and a conductive layer on an inner surface of the groove. Preferably, the conductive layer includes an impurity-diffusion layer. The impurity-diffusion layer may be an impurity implantation layer. The groove may be a trench formed on a main surface of a substrate. Preferably, the impurity-diffusion layer has a portion that is located on a side wall of the groove and has an impurity concentration lower than that of another portion of the impurity-diffusion layer located on a bottom of the groove. The above-mentioned semiconductor device may further include an insulation film provided on a portion of the impurity-diffusion layer on a side wall of the groove. The above-mentioned semiconductor device may further include a silicide film of a refractory metal provided on a portion of the impurity-diffusion layer provided on the bottom of the groove. The refractory metal may include one of Ti and Co.

There is also provided a method of fabricating a semiconductor device including the steps of defining a buried bit line region on a main surface of a semiconductor substrate by an isolation process, forming a groove in the buried bit line region, forming a conductive layer on an inner surface of the groove, and burying a conductive film in the groove. Preferably, the step of forming the groove includes a step of etching the semiconductor substrate so that the groove is a trench. Preferably, the step of forming the conductive layer includes an ion implantation process so that the conductive layer is an impurity-diffusion layer.

Preferably, the ion implantation process includes the steps of implanting ions into a side wall of the grooves by a first ion implantation process, providing an insulation film on an impurity-diffusion layer formed on the side wall, and implanting ions into a bottom of the groove by a second ion implantation process. Preferably, the above-mentioned method further includes a step of providing a silicide film of a refractory metal on another impurity-diffusion layer formed on the bottom of the groove.

With respect to the above-mentioned method, the step of forming the conductive film may further include a step of providing a film of a conductor on the semiconductor substrate and causing only a portion of the film in the groove to remain by chemical mechanical polishing. Preferably, the step of forming the conductive layer includes a step of providing a sidewall of silicon nitride on the main surface of the semiconductor substrate, so that a region into which ions are implanted is self-aligned by the sidewall of silicon nitride.

According to another aspect of the present invention, preferably, there is provided a method of fabricating a semiconductor process including the steps of forming electrodes extending in a column direction on a semiconductor substrate, forming sidewalls of silicon nitride on side walls of the electrodes, implanting ions into the semiconductor substrate with a mask provided by the sidewalls of silicon nitride so that bit lines are self-aligned, forming word lines extending in a row direction on the semiconductor substrate, and removing portions of the electrodes extending in the column direction, which portions are located in a region in which the word lines are not provided, so that the electrodes are divided into parts. The above-mentioned method may further include a laminate of oxide film-nitride film-oxide film (ONO film) on the main surface of the semiconductor substrate in advance, wherein the step of forming the electrodes includes a step of removing at least the nitride film in the ONO film located in the region not coated with the electrodes.

Preferably, the step of forming the sidewalls of silicon nitride includes a step of implanting ions into regions that are close to the main surface of the semiconductor substrate and are located below lower ends of the side walls of the electrodes, so that core pockets can be defined in the semiconductor substrate. Preferably, the step of implanting ions implants such ions in offset regions away from lower ends of the electrodes by a given distance. Preferably, the step of implanting ions includes a step of siliciding at least exposed surfaces of the bit lines.

According to the present invention, the SONOS type of cell can be formed by providing the diffusion layer bit line in the shallow trench groove in which the conductive film is buried, enabling a decrease in the resistivity of the bit line diffusion layer, without enlarging the area of the diffusion layer bit line of on the main surface of the semiconductor substrate. A semiconductor memory device having stable electric characteristics is obtainable without increasing the cell area.

Additionally, according to the present invention, the memory cell can be downsized by providing sidewalls of $Si_3N_4$ and implanting ions into the sidewalls so as to form the bit lines.

Furthermore, the SONOS type of cell having buried bit lines is configured to include self-aligned bit lines by combining the method of forming the bit line of the diffusion layer in a trench groove by ion implantation, and the method of forming the bit lines by providing the sidewalls of $Si_3N_4$ and implanting ions thereinto. This makes it possible to obtain stable electric characteristics without enlarging the cell area and to downsize of the memory cell as well.

DESCRIPTION OF THE INVENTION

Figure 1A:
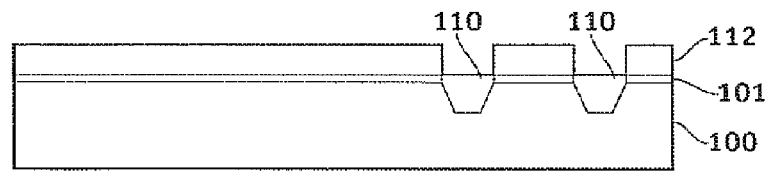
FIGS. 1A through 1H are views illustrating a conventional fabrication process for forming a multi-level cell of the SONOS type having buried bit lines.
Figure 1B:
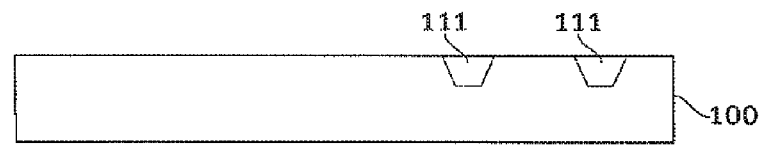
Figure 1C:
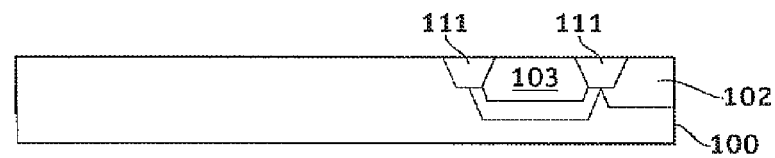
Figure 1D:
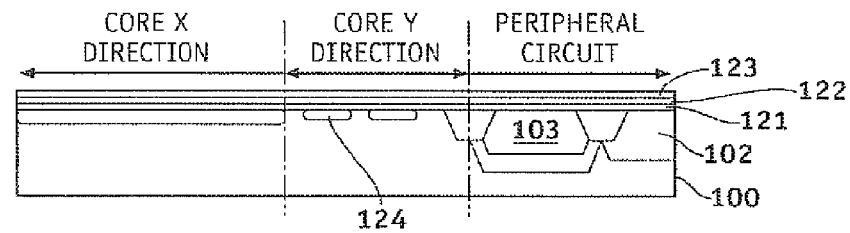
Figure 1E:
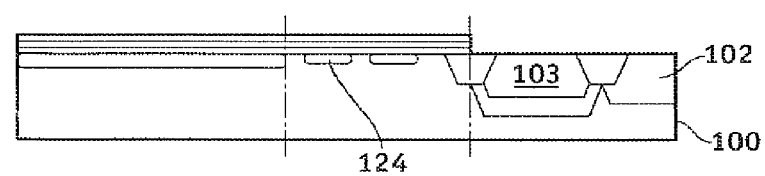
Figure 1F:
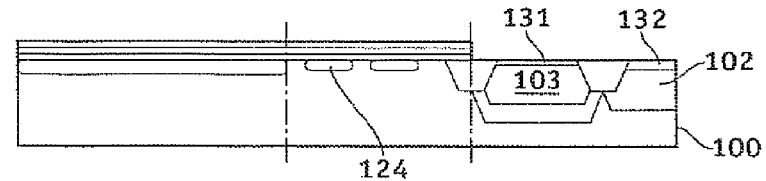
Figure 1G:
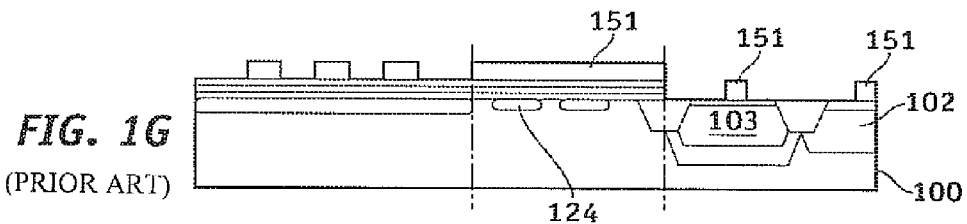
Figure 1H:
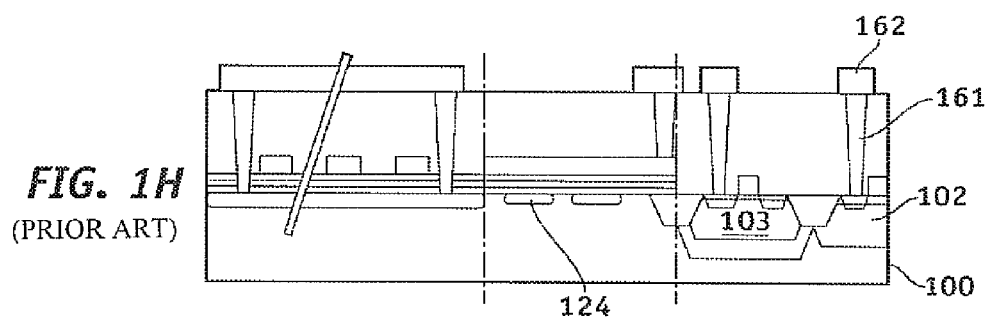
Figure 2A:
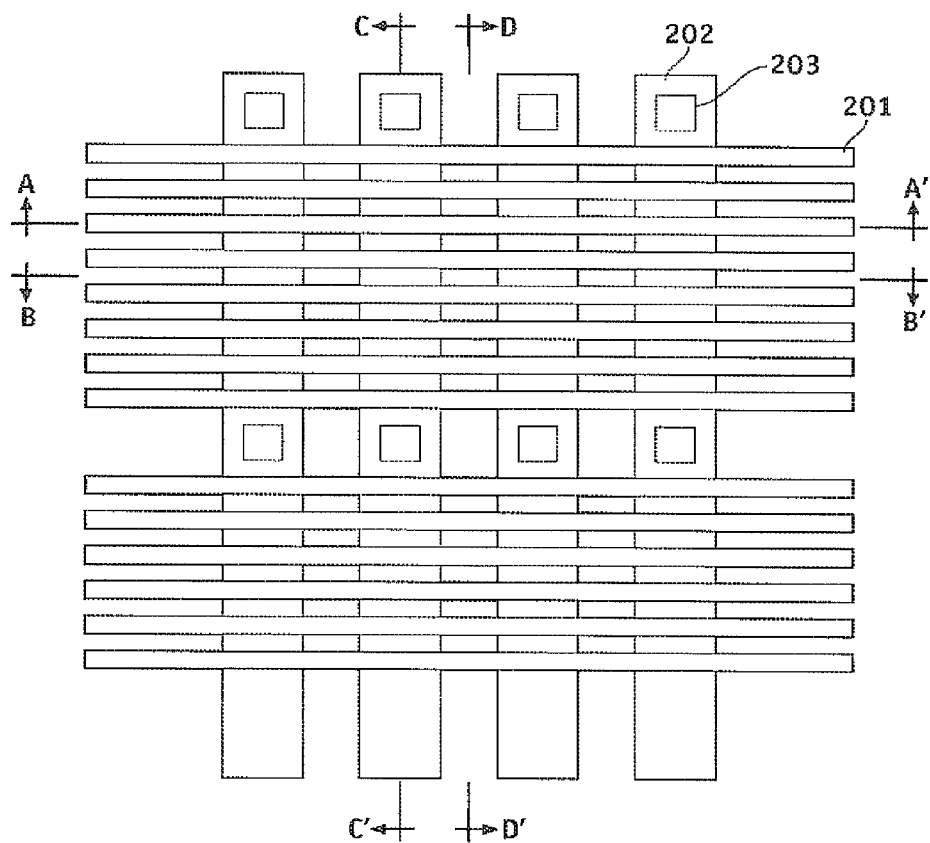
FIG. 2A is a schematic plan views of a SONOS type cell architecture having buried bit lines (FIGS. 2B-2E show cross-sectional views taken along lines A-A', B-B', C-C', and D-D' shown in FIG. 2A)
Figure 2B:
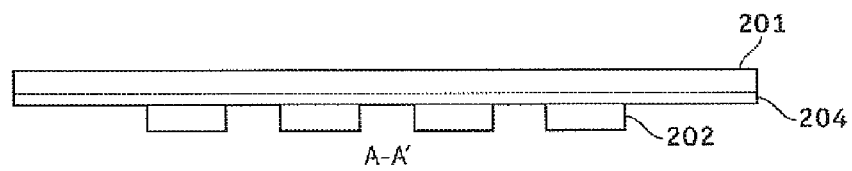
Figure 2C:
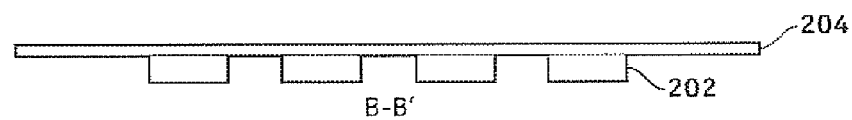
Figure 2D:
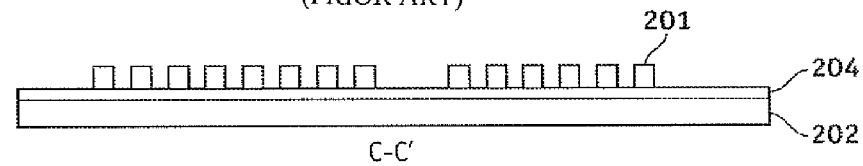
Figure 2E:
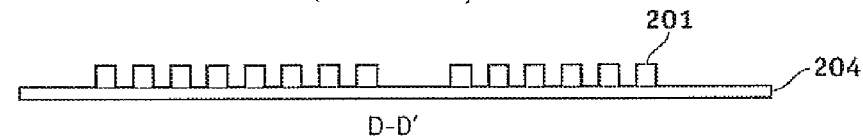

The following detailed description of the invention is merely exemplary in nature and is not intended to limit the invention or the application and uses of the invention. Furthermore, there is no intention to be bound by any theory presented in the preceding background of the invention or the following detailed description of the invention.

First Embodiment

FIGS. 3A through 3H are views illustrating a first embodiment of a fabrication process for forming a SONOS type multi-level cell architecture having buried bit lines in accordance with a first embodiment of the present invention. In the drawings, there is shown a semiconductor substrate 300, an insulating film 301 such as a nitride film, well regions 302 and 303, a mask for forming bit lines 304, a shallow trench groove 305 for forming bit lines, a trench groove 310 for element isolation, an insulating film 311 for element isolation, a tunnel insulating film 321, a nitride film 322 for storage, an upper oxide film 323 of an ONO stack, a bit line 324 of the diffusion layer in the trench groove, a conductive film 320 buried in the bit line trench, gate oxide films 331 and 332, a gate electrode 351, a contact hole 361, and wiring 362.

Figure 3A:
FIGS. 3A through 3H are views illustrating a fabrication process of an embodiment for forming a SONOS type multi-level cell architecture having buried bit lines embodying the present invention.

Referring to FIG. 3A, insulating film 301 is formed on a main surface of semiconductor substrate 300. A resist pattern is formed on the insulating film 301 using photolithography and etching techniques to provide the trench groove 310 for element isolation. The buried insulating film is grown on the main surface of the semiconductor substrate 300. CMP is carried out to expose the insulating film 301. The aforementioned buried insulating film remains only inside trench groove 310 and insulating film 311 for element isolation is formed.

For example, substrate 300 is a p-type semiconductor substrate. The $Si_3N_4$ film is grown approximately 100 nm as the insulating film 301, and the resist to be patterned is applied. The resist pattern is used as a mask to etch a given portion of the $Si_3N_4$ film and the semiconductor substrate so as to create trench 310 for element isolation having a depth of approximately 350 nm. Then, a HDP (high-density plasma) oxide film having a thickness of approximately 550 nm, for example, is grown as the buried insulating film, and the aforementioned HDP oxide film is polished using a CMP process so as to remain only inside the trench groove 310 for element isolation. The $Si_3N_4$ film serving as the insulating film 301 is removed by etching with phosphoric acid.

Figure 3B:
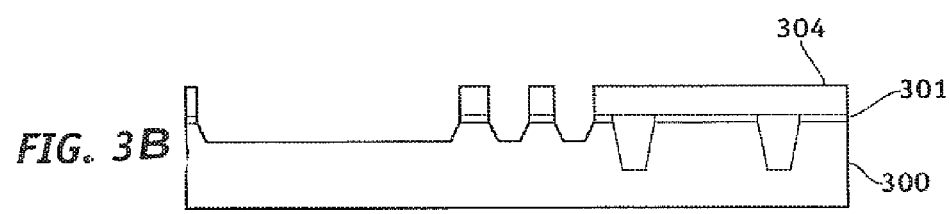
Figure 3C:
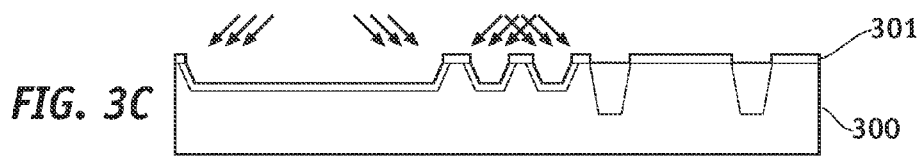

Subsequently, the resist is patterned to form mask 304 for forming bit lines, and is etched to form the shallow trench groove for forming bit lines 305 (FIG. 3B). The $Si_3N_4$ film is etched through the openings in mask 304 for forming bit lines, and the semiconductor substrate 300 is further etched, for example, to approximately 100 nm. Then, mask 304 for forming bit lines is removed and the bit line of diffusion layer 324 is formed by ion implantation (FIG. 3C). This is accomplished using, for example, 35 KeV of accelerating voltage and an arsenic concentration of $2 \times 10^{15}$ cm$^{-2}$. Ions are implanted in two or four directions with a tilt angle of 30 degrees so that the ions bombard the side walls of the trench groove.

An accelerating energy of at least 110 KeV is necessary for the arsenic ions to pass through the nitride film having a thickness of approximately 100 nm and be implanted into the semiconductor substrate 300 (silicon substrate) of a base layer. Therefore, the arsenic ions are only implanted into the shallow trench groove 305 provided for forming bit lines. It is also possible to implant the ions into the shallow trench groove 305 provided for forming bit lines using the remaining mask for forming bit lines. However, in this case, the tilt angle for ion implantation should be adjusted due to the height of the mask 304.

Figure 3D:
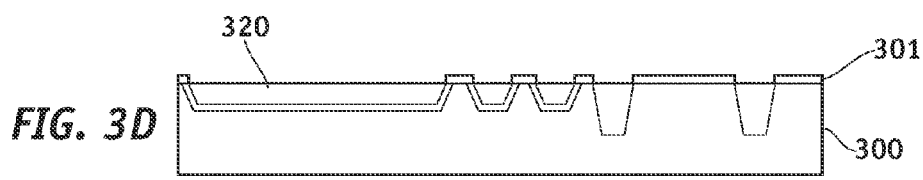
Figure 3E:
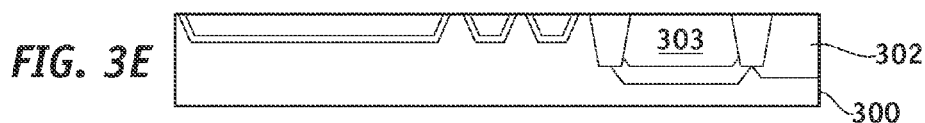

Then, the conductive film is grown on the entire surface of the semiconductor substrate 300 and polished by CMP so that a conductive film 320 is buried only in shallow trench groove 305 that is provided for forming bit lines (FIG. 3D). That is, this architecture has a conductive film 320 inside the shallow trench groove 305. The conductive film 320 is made of a polysilicon film, for example, having a thickness of approximately 200 nm and a phosphorus concentration of $1 \times 10^{20}$ cm$^{-3}$. The conductive film 320 of this polysilicon film is polished by CMP to create the shallow trench groove 305, in which the conductive film 320 is buried. Then, the insulating film 301 is removed, and the well regions 302 and 303 are created in the peripheral circuit region by ion implantation (FIG. 3E). In this process, for example, an applied resist is patterned, and phosphorous ions are implanted using the resist pattern as a mask. Here, in addition to the implantation of phosphorous ions, boron ions may be implanted to create a triple well structure in well region 303.

Figure 3F:
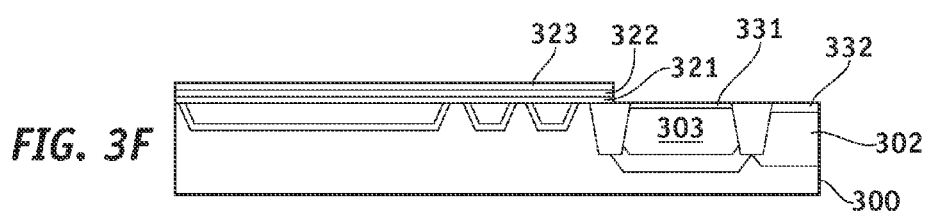

Furthermore, the tunnel insulating film 321, the nitride film 322 for storage, and the upper oxide film 323 are successively stacked to form the ONO stack. The ONO stack in the peripheral circuit region is removed by photolithography techniques and thermal oxidization to form the gate oxide films 331 and 332, having different thicknesses, in the peripheral circuit region (FIG. 3F). In this process, for example, the main surface of the semiconductor substrate 300 is thermally oxidized to form the tunnel oxide film to a thickness of approximately 7 nm after the insulating film arranged in the core region and the insulating film arranged in the peripheral circuit region are removed from the main surface of the semiconductor substrate 300 by HF. A nitride film grown by CVD with a thickness of approximately 10 nm is deposited on the tunnel oxide film. Moreover, the surface of the nitride film grown by CVD is thermally oxidized to form the upper oxide film to a thickness of approximately 10 nm and create the ONO stack. In addition, in order to form the gate insulating films 331 and 332, for example, a gate insulating film having a thickness of approximately 8 nm is firstly provided by thermal processing at 900° C. The resist is patterned, removed by HF, and then thermally oxidized at 900° C. again to provide a thermal oxide film having a thickness of approximately 10 nm. In this manner, two different thicknesses, 10 nm and 13 nm, can be deposited.

Figure 3G:
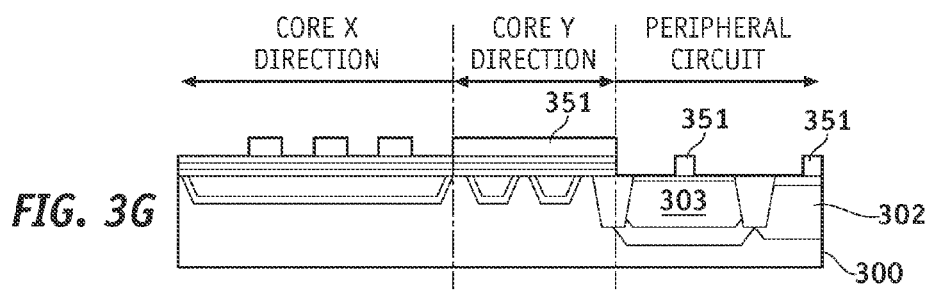
Figure 3H:
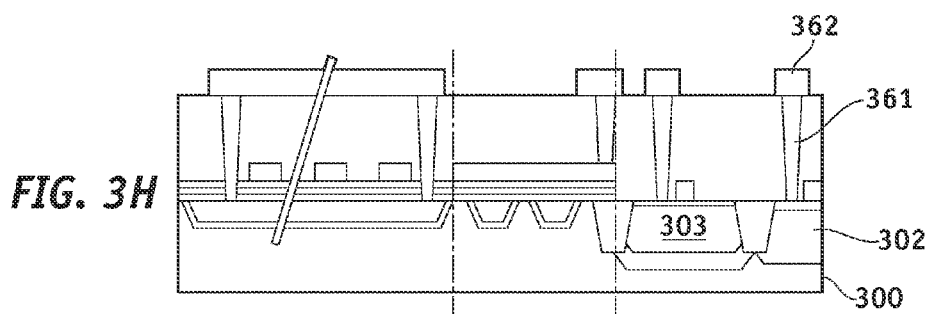

After the aforementioned gate insulating films are deposited, a conductive film is grown on the ONO stack and the gate insulating films. The resist is patterned and etched to form the word lines and the gate electrodes 351 in the periphery circuit (FIG. 3G). This conductive film provided for the gate electrode is, for example, a polysilicon film with the thickness of approximately 180 nm grown by a thermal CVD method. In the end, the source/drain region is formed in the peripheral circuit region by resist patterning and ion implantation. A silicide film may be formed, an interlayer insulating film may be grown, and the contact holes 361 and the wiring 362 may be formed, as necessary (FIG. 3H).

In this manner, there is provided a SONOS type cell, in which the bit line of the diffusion layer 324 is provided in the shallow trench groove 305 having a conductive film 320 buried therein. It is possible to reduce the resistivity of the bit line without enlarging the area on the main surface of the semiconductor substrate. This makes it possible to obtain a semiconductor memory device with stable electric characteristics without enlarging cell area.

Second Embodiment

This embodiment relates to a fabrication process for further reducing the resistivity of the buried bit line of the diffusion layer to a greater extent than the bit line of diffusion layer described in accordance with the first embodiment.

FIGS. 4A through 4E are views illustrating a second embodiment of a fabrication process for forming a SONOS type of multi-level cell having buried bit lines in accordance with a second embodiment of the present invention. In the drawings there is shown a conductive or insulating film 312 provided on side walls of the shallow trench groove 305 provided for forming bit lines, and first and second diffusion layers 325 and 326 for bit lines. Hereinafter, in the second embodiment, the same components and configurations as those in FIGS. 3A through 3H have the same reference numerals.

Figure 4A:
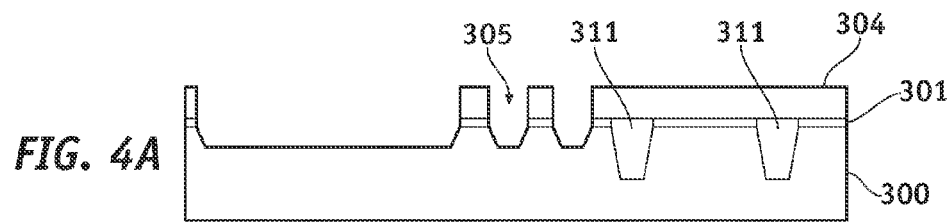
FIGS. 4A through 4E are views illustrating a second fabrication process of an embodiment for forming a SONOS type of multi-level cell having buried bit lines embodying the present invention.

As described in FIG. 3A, after the insulating film 311 is formed inside the trench groove 310 for element isolation, the mask 304 for forming bit lines is formed by resist patterning. The shallow trench groove 305 for forming bit lines is formed by etching (FIG. 4A). The $Si_3N_4$ film is etched from the openings of the mask 304 for forming bit lines, and then, for example, approximately 100 nm in thickness of the semiconductor substrate 300 is etched away.

Figure 4B:
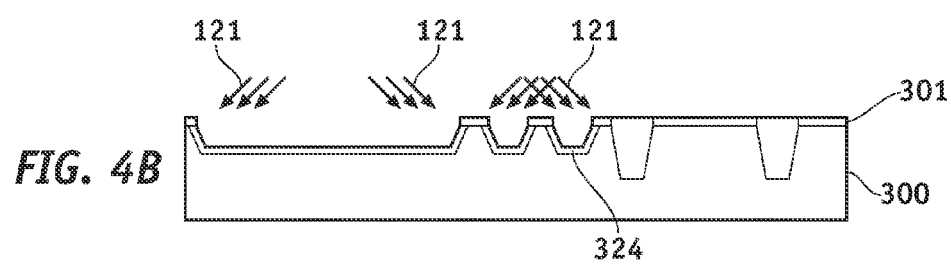

Subsequently, the mask 304 provided for forming bit lines is removed to form the first bit lines of diffusion layer 325 in the trench groove by ion implantation ($I^2_1$) (FIG. 4B). Here, the implantation concentration is smaller than that used for forming the second bit line of diffusion layer 326 in the trench groove, as will be described later. For example, the accelerating voltage is 20 KeV and the concentration of arsenic ions is $5 \times 10^{14}$ cm$^{-2}$. Ions are implanted in two or four directions with a tilt angle of 30 degrees so that the side walls of the trench groove are bombarded.

Figure 4C:
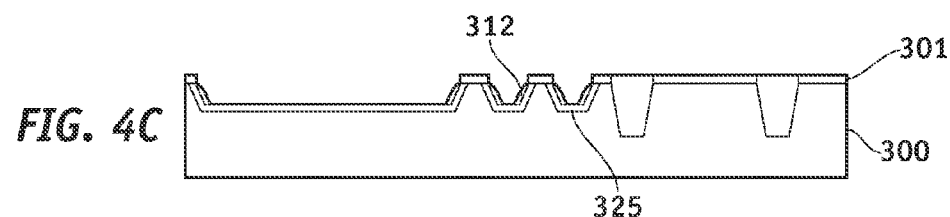

Next, either a conductive film or an insulating film is provided over the entire main surface of the semiconductor substrate 300, and is anisotropically etched to leave film 312 only on the side walls of the shallow trench groove 305 (FIG. 4C). This process can be carried out in the same manner as forming the sidewalls. Specifically, an oxide film having a thickness of approximately 50 nm, for example, is grown and etched anisotropically to leave film 312 only on the side walls of the shallow trench groove 305. Film 312 may be a conductive film made of a polysilicon film. This insulating film 312 functions as a protection film.

Figure 4D:
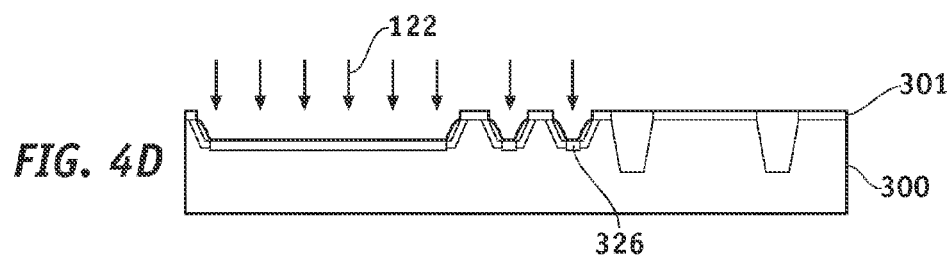

In addition, a second ion implantation ($I^2_2$) step is performed using insulating film 301 and film 312 as masks. The second bit lines of diffusion layer 326 in the trench groove are formed on the bottom of the shallow trench grooves 305 (FIG. 4D). Here, the implantation concentration is greater than that used for forming the first bit lines of diffusion layer in the trench groove. For example, the accelerating voltage is 35 KeV and the concentration of arsenic ions is $2 \times 10^{15}$ cm$^{-2}$. The tilt angle is configured to be zero degrees so that only the bottoms of the trench grooves are bombarded. However, if required, the ions may be implanted in two or four directions so that the side walls of the trench grooves are also bombarded.

Subsequent to the process shown in FIG. 4D, a silicide film of a refractory metal (such as Ti or Co), not shown, may be formed on the bit line in the trench groove. As shown in FIG. 4D, only the silicon surface of the bit line in the trench groove is exposed, so it is easy to form the silicide film only on the bit line using known silicide film-forming techniques. When forming the silicide film, the refractory metal is grown, and only the refractory metal in contact with the silicon surface undergoes a thermal processing and is converted to silicide. The refractory metal that is not converted is removed by wet etching, and the silicide is thermally treated again to lower the resistivity thereof.

Figure 4E:
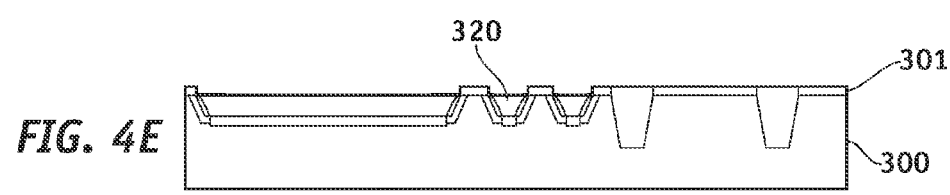

Next, a conductive film is grown over the entire surface of the semiconductor substrate 300 and is polished by CMP so that conductive film 320 may be buried only in the shallow trench groove 305 (FIG. 4E). The conductive film 320 is, for example, a polysilicon film having a thickness of approximately 200 nm and a phosphorus concentration of $1 \times 10^{20}$ cm$^{-3}$. The conductive film 320 is polished by CMP and buried in the shallow trench groove 305.

Then, as described in FIG. 3E, the insulating film 301 is removed and the well regions 302 and 303 are formed in the peripheral circuit region by ion implantation. Also in this process, for example, a resist is applied for patterning, and phosphorous ions are implanted by using the resist pattern as a mask. After the phosphorus ions are implanted, boron ions may be implanted to create a triple well structure in the well region 303.

Further, as shown in FIG. 3F, the tunnel insulating film 321, the nitride film 322 for storage, and the upper oxide film 323 are successively stacked to create the ONO stack. The ONO stack in the peripheral circuit region is removed using photolithography techniques. The gate oxide films 331 and 332, which are different in thickness, are formed in the peripheral circuit region by thermal oxidation. In this process, the main surface of the semiconductor substrate 300 is thermally oxidized to form the tunnel oxide film to a thickness of approximately 7 nm. After removing the insulating film in the core region and the insulating film in the peripheral circuit region using HF, a nitride film is grown by CVD to a thickness of approximately 10 nm on the tunnel oxide film. Moreover, the surface of the nitride film grown by CVD is thermally oxidized to stack the upper oxide film to a thickness of approximately 10 nm and form the ONO stack. In order to form the gate insulating films 331 and 332, for example, the gate insulating film is firstly formed to a thickness of approximately 8 nm by thermal processing at approximately 900° C. After the resist is patterned and removed using HF, the thermal oxidation is again performed at approximately 900° C. to form a thermal oxide film having a thickness of approximately 10 nm. In this manner, two different oxide layers having thicknesses, of approximately 10 nm and 13 nm respectively, can be deposited.

After the aforementioned gate insulating films are deposited, conductive films for the gate electrode are grown on the ONO stack and on the gate insulating film. A resist is patterned and etched to form the word lines and the gate electrodes 351 in the periphery circuit. The conductive films for the gate electrode are, for example, polysilicon films having a thickness of approximately 180 nm, which is grown using a thermal CVD method. In the end, the source/drain region is formed in the peripheral circuit region by resist patterning and ion implantation. A silicide film may be formed, an interlayer insulating film may be grown, and the contact holes 361 and the wiring 362 may be formed, as necessary.

As described above, a SONOS type of cell is obtainable that includes first and second bit lines of diffusion layers 325 and 326 in the shallow trench grooves 305 in which the conductive film 320 is buried. The bit lines of this type of cell are composed of a first bit line of diffusion layer 325 and a second bit line of diffusion layer 326, making it possible to further decrease the resistivity thereof, as compared to the bit line in the cell of the first embodiment. It is therefore possible to obtain a semiconductor memory device having more stable electric characteristics without enlarging the cell area.

Third Embodiment

This present embodiment shows a third embodiment of a method for fabricating a SONOS type of multi-level cell with the buried bit lines in accordance with the present invention, by implanting ions with a mask of $Si_3N_4$ formed on the side walls of (lower portions of) the gate electrodes provided in the core region so as to form the bit lines in a self-aligned manner. It is possible to achieve ion bombardment on only a narrow region due to the sidewalls of $Si_3N_4$. Thus, it is possible to form bit lines having narrow widths, as be described later in detail. Also, it is possible to form contacts in a self-aligned manner as a result of employing $Si_3N_4$ for the sidewalls.

FIGS. 5 through 14 are views illustrating a process for forming a SONOS type of multi-level memory cell having narrow width bit lines in accordance with an embodiment of the present invention.

Figure 5:
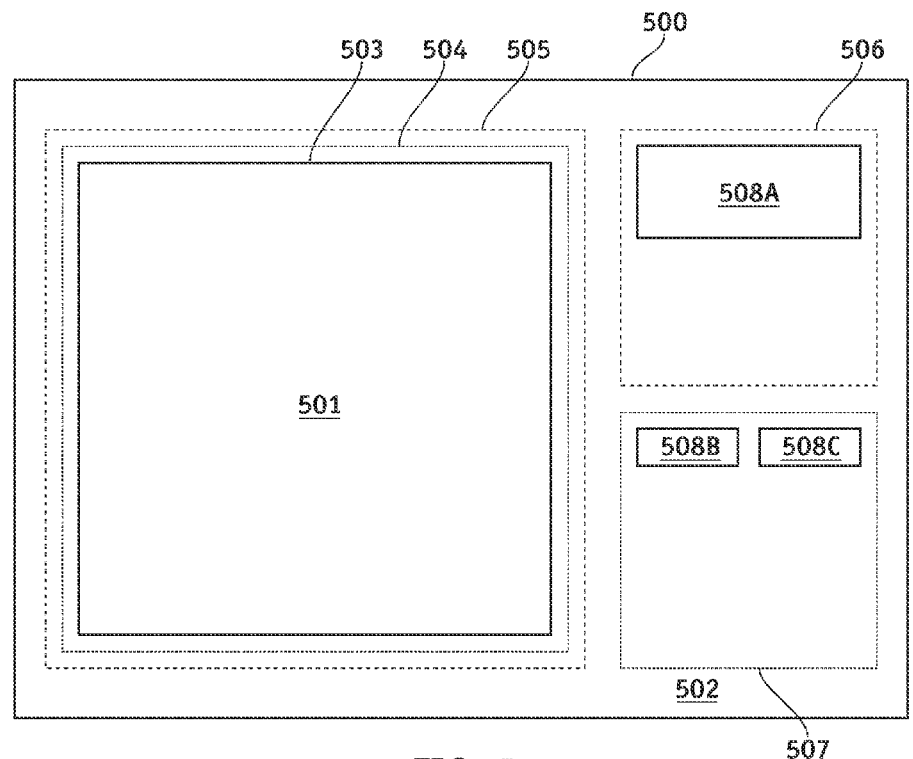
FIG. 5 is a view illustrating a fabrication process in accordance with a third embodiment for forming a SONOS type of multi-level cell having buried bit lines and is a schematic top view of a single die region.

FIG. 5 is a schematic top view of a single die region. One die region 500 includes a core region 501 and a peripheral circuit region 502. There are also provided an element isolation boundary 503, a first core well boundary 504, and a second core well boundary 505 outside of the core region 501. In addition, there are also provided regions respectively defined by element isolation boundaries 508a, 508b, and 508c in regions defined by either a first periphery well boundary 506 or a second periphery well boundary 507 included in a portion of the peripheral circuit region 502. The memory cell transistors are arranged in an array in the core region 501 and multiple peripheral transistors and other elements are arranged in the peripheral circuit region 502.

Figure 6A:
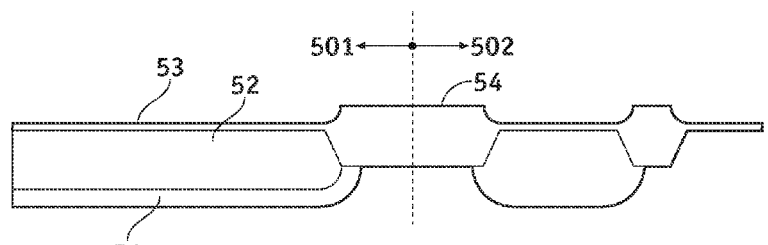
FIG. 6A is a schematic cross-sectional view showing the core region of the peripheral circuit region in the die.

FIG. 6A is a schematic cross-sectional view showing the core region and the peripheral circuit region in the die. First and second wells are formed on a semiconductor substrate 50. The surface of the semiconductor substrate 50, which will later become an active region, is covered with a sacrificial film 53. A shallow trench 54 is formed in an element isolation region that isolates the active region. In a SONOS type of memory having buried bit lines, the element isolation region is not necessarily essential in core region 501. Therefore, the well structure shown in this drawing is not essential in a SONOS type memory having buried bit lines. The detailed fabrication process is as follows. A silicon substrate is employed for the semiconductor substrate 50. A silicon oxide film formed by thermal oxidation is employed for the sacrificial film 53. The shallow trench 54 is created using known techniques for creating an element isolation structure. Wells 51 and 52 are created by implanting ions such as boron, phosphor, and arsenic in a given region and to a given depth, using a patterned photoresist for a mask.

Figure 6B:
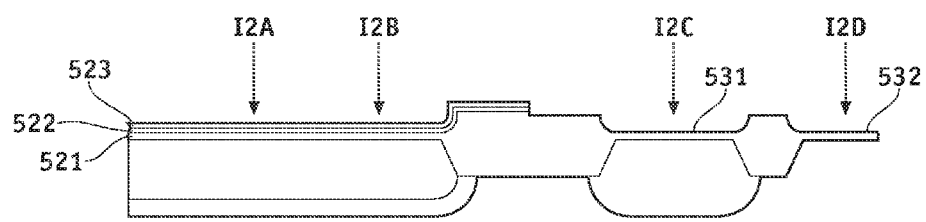
FIG. 6B is a schematic cross-sectional view of the ONO film that has been stacked subsequent to the process shown in FIG. 6A.

FIG. 6B is a schematic cross-sectional view of an ONO film that has been stacked subsequent to the process shown in FIG. 6A. A tunnel film 521, a storage film 522, and a top film 523 are successively stacked in order in the core region 501 and on the main surface of the semiconductor substrate 50. A thick gate insulating film 531 and a thin gate insulating film 532 are formed in the active region provided in peripheral circuit region 502. Impurities $I^2_a$ through $I^2_d$ are injected into the active regions of the semiconductor substrate 50 so as to respectively adjust the threshold values. The detailed fabrication process is as follows. Impurities such as boron, phosphorous, or arsenic ions are bombarded so as to adjust the threshold values. As the tunnel film 521, the silicon oxide film is formed by the thermal oxidation method, after the silicon oxide film serving as the sacrificial film 53 is stripped away from the entire main surface of the semiconductor substrate 50 by fluorinated acid (HF). For the storage film 522, the silicon nitride film is deposited on the entire surface of semiconductor substrate 50 using a thermal CVD process. For the top film 523, the silicon oxide film is formed by thermally oxidizing the surface of the nitride film 522, or the silicon oxide film is deposited on the nitride film using a thermal CVD process.

The thick gate insulating film 531 becomes thick as a result of two thermal oxidation processes, namely, a "double gate process". The photoresist is patterned to cover the core region 501, and the top film 523 and the storage film 522 formed in the peripheral circuit region 502 are removed by dry etching. Additionally, the tunnel film 521 in the peripheral circuit region 502 is removed by fluorinated acid to form the silicon oxide film (thermally-oxidized film).

Also, for the thin gate insulating film 532, a resist is patterned after the thick gate insulating film 531 is formed. Openings are provided in given regions for etching therethrough with fluorinated acid. The silicon oxide film is formed in the aforementioned regions by a thermal oxidation method. The tunnel film ($SiO_2$) 521, the storage film ($Si_3N_4$), and the top film ($SiO_2$) 523 are stacked to form the ONO film.

Figure 6C:
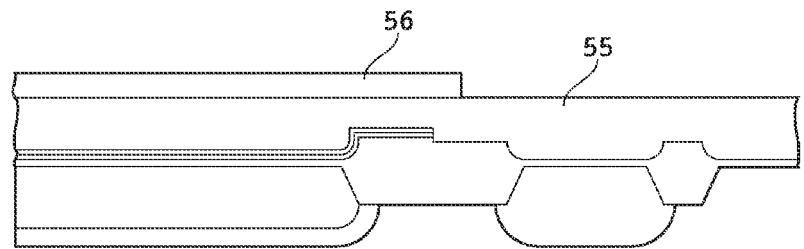
FIG. 6C is a schematic cross-sectional view showing the region between the core region and the peripheral circuit region of the die, subsequent to the process shown in FIG. 6B.

FIG. 6C is a schematic cross-sectional view showing the core region and the peripheral circuit region in the die, subsequent to the process shown in FIG. 6B. A gate electrode film 55 and a cap film 56 are deposited on the aforementioned ONO film in the core region 501. Only the gate electrode film 55 is formed in the peripheral circuit region 502. With this architecture, it is possible to fabricate the word line in the core region 501 and fabricate the plug and wiring in the peripheral circuit region 502 simultaneously, as will be described below in detail. Specifically, in the fabrication process, for the gate electrode film 55, either doped (or undoped) amorphous silicon or doped (or undoped) polysilicon grown using a thermal CVD method is used. For the cap film 56, the silicon nitride film is grown by a thermal CVD or plasma CVD method. Only the cap film 56 provided in the peripheral circuit region 502 is removed by dry etching using a patterned resist used for the mask.

Figure 6D:
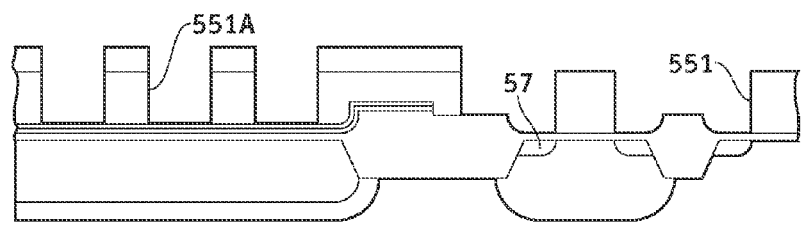
FIG. 6D is a schematic cross-sectional view showing the region between the core region and the peripheral circuit region of the die, subsequent to the process shown in FIG. 6C.

FIG. 6D is a schematic cross-sectional view showing the core region and the peripheral circuit region in the die, subsequent to the process shown in FIG. 6C. A portion 551a corresponding to a lower portion of a gate electrode 551 is formed in the core region 501, and the gate electrode 551 and a lightly doped drain (LDD) 57 are formed in the peripheral circuit region 502.

Figure 7:
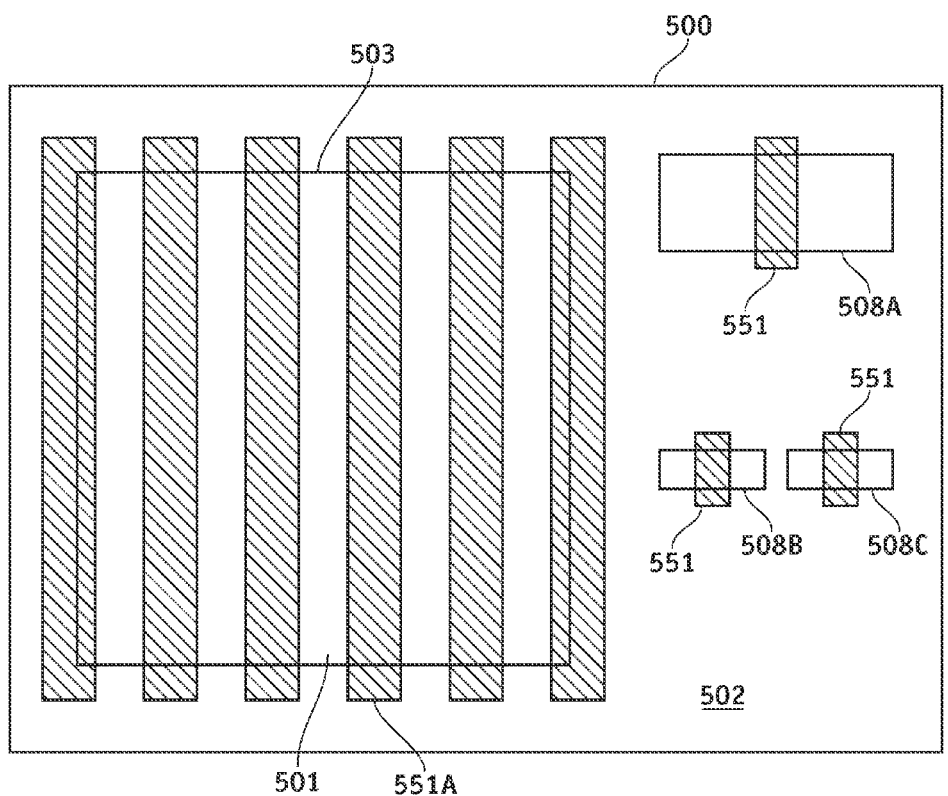
FIG. 7 is a view illustrating the process of a third embodiment for forming a SONOS type multi-level cell architecture with the buried bit lines, and is a schematic top view of the memory cell shown in FIG. 6D.

FIG. 7 is a schematic top view of the die shown in FIG. 6D. It should be noted that all of the gate electrode lower portions 551a remaining in the core region 501 will not remain in a completed semiconductor device. That is to say, in this stage, the gate electrode lower portions 551a are arranged in multiple stripes extending in a bit line direction (column direction), and are then separated in a word line direction (row direction) using a process described below.

Figure 8A:
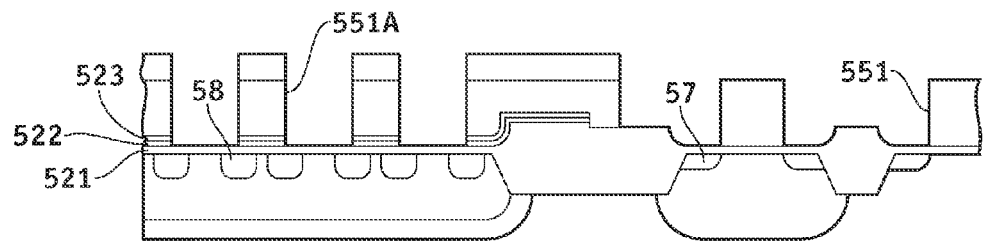
FIG. 8A is a schematic top view of the cell subsequent to the process shown in FIG. 6D.

FIG. 8A is a schematic top view of the core region and the peripheral circuit region subsequent to the process shown in FIG. 6D. The top film 523 and the storage film 522 in the ONO are removed except in the area of the gate electrode lower portion 551a. Thus, the storage film 522 does not overlap the bit lines, thereby ensuring enhanced rewriting characteristics. Core pockets 58 are formed in the core region 501 by ion implantation at a given tilt angle (pocket structure). This makes it possible to suppress the short channel effect since the space between the bit lines is narrow. When the bit lines are formed by ion implantation using a resist mask in accordance with conventional methods, it is difficult to form the bit line if the minimum line width is smaller than approximately 130 nm. In particular, it is extremely difficult to form the bit line if the minimum line width is smaller than approximately 90 nm. In contrast, in accordance with the above-described method, the core pockets 58 are formed by using the lower portion 551a of the gate electrode as the mask. It is therefore possible to downsize the bit line with a resist mask.

Figure 8B:
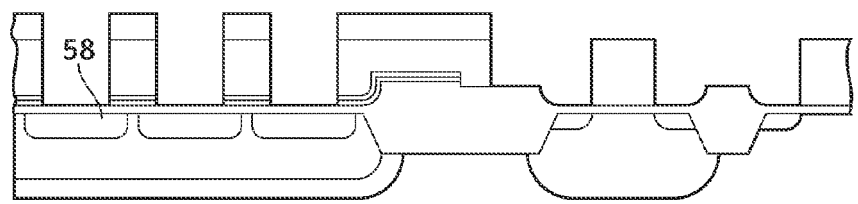
FIG. 8B is a schematic cross-sectional view of the cell subsequent to the process of FIG. 6D.
Figure 8C:
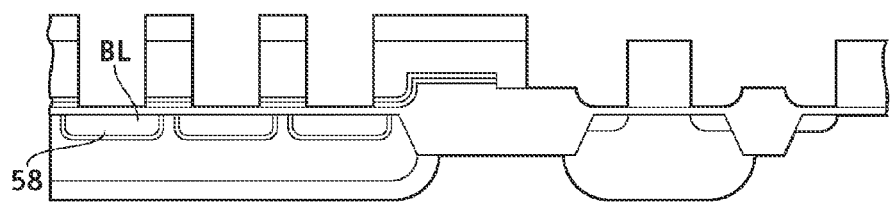
FIG. 8C is a schematic cross-sectional view of the cell subsequent to two ion implantations to form the bit lines BL subsequent to the process of FIG. 8B.

FIG. 8B is a schematic cross-sectional view of the core region and the peripheral circuit region subsequent to the process of FIG. 6D, where the ions are implanted in the core pockets 58 at the angle of 0 degrees. In FIG. 8A, the core pockets 58 are formed in lower-end regions of the gate electrode lower portion 551a. In FIG. 8B, however, the core pockets 58 are formed in the main surface regions between the respective gate electrode lower portions 551a of the semiconductor substrate 50 during the ion implantation. FIG. 8C is a schematic cross-sectional view of the core region and the peripheral circuit region subsequent to a second ion implantation for forming bit lines BL, subsequent to the process of FIG. 8B.

The structures shown in FIG. 6D, FIG. 8A, FIG. 8B and FIG. 8C respectively include gate electrode lower portions 551a in the core region 501 and the gate electrodes 551 in the peripheral circuit region 502, which can be accomplished by patterning a resist and dry etching the cap film 56 and the gate electrode film 55. The LDD 57 can be formed by ion implantation using resist having openings in given portions and using the gate electrode 551 in the peripheral circuit region 502 for the mask. In addition, the core pockets 58 in the core region 501 and the bit lines BL can be created by ion implantation using the resist having openings in the core region 501 and the gate electrode lower portion 551a in the core region 501 as the mask.

Figure 8D:
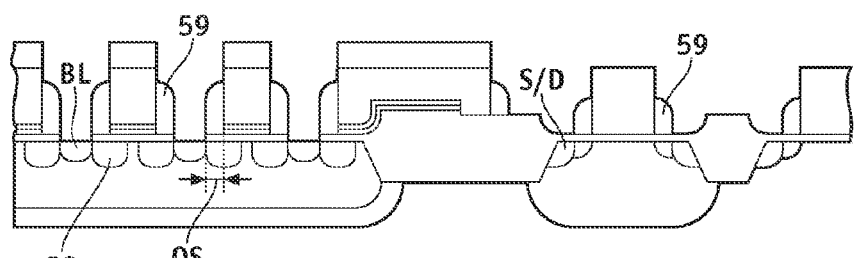
FIG. 8D is a schematic cross-sectional view of a cell.
Figure 9:
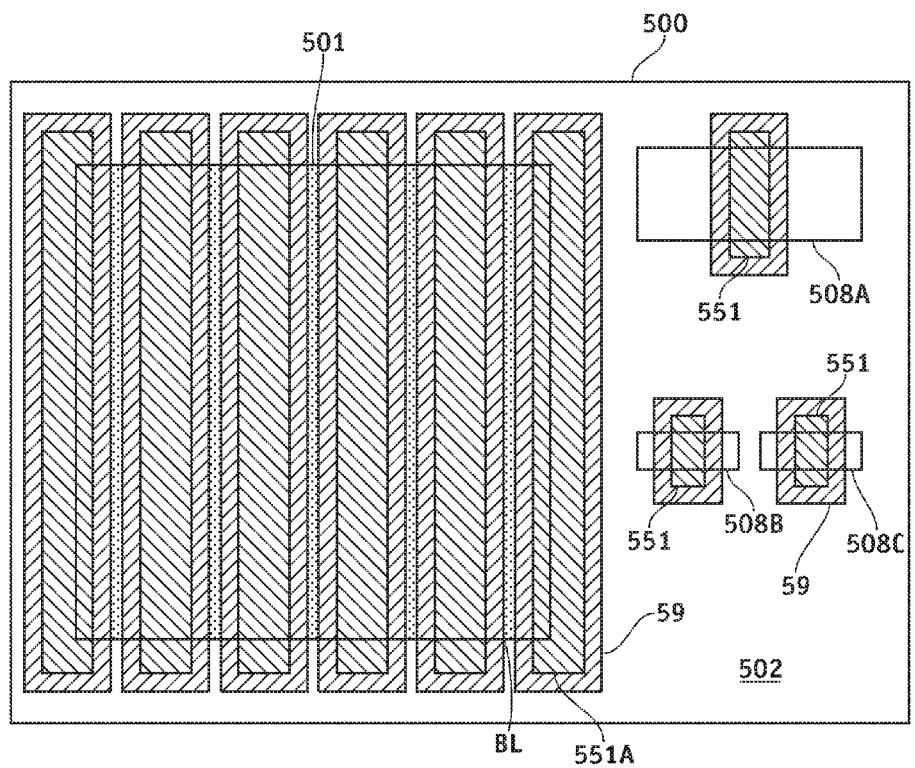
FIG. 9 is a view illustrating the process of the third embodiment for forming a SONOS type multi-level cell architecture having buried bit lines, and is a schematic top view of the cell subsequent to the process shown in FIG. 8A.

When ions are implanted in the bit line as shown in FIG. 8C, the ions can be implanted after the side walls of the gate electrodes 551 in the peripheral circuit region 502 and the gate electrode lower portions 551a in the core region 501 are oxidized, after impurities are activated in the LDD 57 in the peripheral circuit region 502, and after impurities are activated in the core pockets 58 in the core region 501. Accordingly, impurity diffusion can be suppressed in the bit lines, and when compared to the conventional fabrication method, has an advantage when downsizing. FIG. 8D is a schematic cross-sectional view of the die, and FIG. 9 is a schematic top view of the die subsequent to the process shown in FIG. 8A. Sidewalls 59 are formed on the lower portion of gate electrode 551a in the core region 501 and on the gate electrodes 551 in the peripheral circuit region 502. The bit line BL of the core region 501 and the source/drain (S/D) of the peripheral circuit region 502 are formed in the active regions, which are exposed and not covered by the gate electrodes 551 or the sidewalls 59. The sidewalls 59 are formed by etching back anisotropically the silicon nitride film grown on the entire wafer surface using a thermal CVD method. The bit line BL is formed by implanting arsenic ions using a resist mask having openings only in the core region 501. The gate electrode lower portions 551a in the core region 501 and the sidewalls 59 on the side walls on the gate electrode lower portions 551a are used as a mask. Additionally, the source/drain (S/D) in the peripheral circuit region 502 is obtainable by implanting impurities such as arsenic, phosphor, or boron using a resist mask having openings only in the peripheral circuit region 502 and the sidewalls 59 as a mask on the side walls of the gate electrodes 551.

As shown in FIG. 8D, by forming bit line BL using the mask of the sidewalls 59, it is possible to implant ions to form the bit line in a narrower region. This offers the advantage of bit line miniaturization. After the subsequent processes are completed, it is possible to provide an offset (OS) in a junction between the gate electrode lower portion 551a and the bit line BL, or it is possible to match the junctions to edges of the gate electrode lower portion 551a in a lateral direction. This makes it possible to suppress the positional misalignment of the negative charge injected during programming and the positive charge injected during erasing, thereby enhancing rewriting characteristics.

Figure 10A:
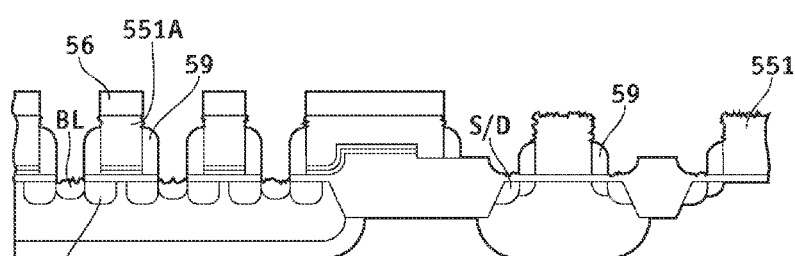
FIG. 10A is a schematic cross-sectional view of the cell in the salicide process subsequent to the process shown in FIG. 8D.

FIG. 10A is a schematic cross-sectional view of the core region and the peripheral circuit region subsequent to the salicide process shown in FIG. 8D. Silicide (shown as wavy lines in drawings) is formed on the surfaces of the bit lines BL formed in the core region 501, the exposed surfaces of the source/drain (S/D) formed in the peripheral circuit region 502, the side walls of the gate electrode lower portions 551a in the core region 501 that are exposed without being covered with the sidewalls 59 or the cap films 56, and the surfaces of the side walls and top surfaces that are exposed without being covered with the sidewalls 59 on the side walls of the gate electrodes 551 in the peripheral circuit region 502. This is accomplished using a conventional salicide process that employs cobalt. Silicided surfaces, not covered by sidewalls 59 are also formed during the process.

Figure 10B:
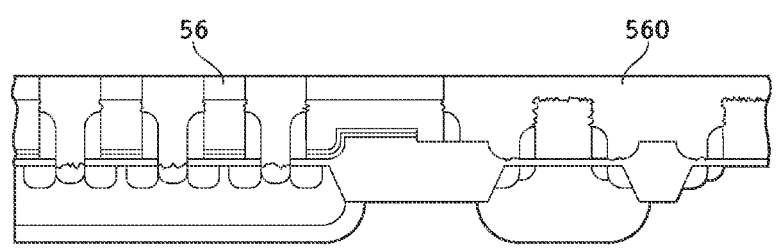
FIG. 10B is a schematic cross-sectional view of the cell subsequent to the process shown in FIG. 10A.

FIG. 10B is a schematic cross-sectional view of the core region and the peripheral circuit region subsequent to the process shown in FIG. 10A. Gap fill films 560 are formed between the gates in the core region 501 and on a main surface of the wafer in the peripheral circuit region 502, and the surfaces thereof are planarized. The silicon oxide film is deposited using a CVD method such as BPSG, TEO, or HDP, as the gap fill film 560, and the cap films 56 provided on the gates in the core region 501 are polished using a CMP as a pad film.

Figure 10C:
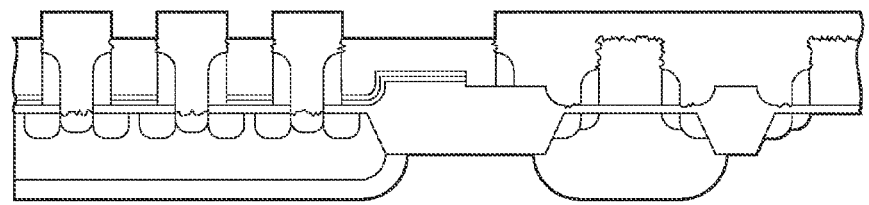
FIG. 10C is a schematic cross-sectional view of the cell subsequent to the process shown in FIG. 10B.

FIG. 10C is a schematic cross-sectional view of the core region and the peripheral circuit region subsequent to the process shown in FIG. 10B. The cap films 56 provided on the top surfaces of the gate electrode lower portions 551a in the core region 501 are removed and the surfaces of the gate electrode lower portions 551a are exposed. Here, the cap films 56 in the gate electrodes 551 in the periphery region 502 have been removed in FIG. 6C. Specifically, the nitride film serving as the cap film 56 is wet etched by hot phosphoric acid to remove the cap film 56 provided on the top surface of the gate electrode lower portion 551a.

Figure 10D:
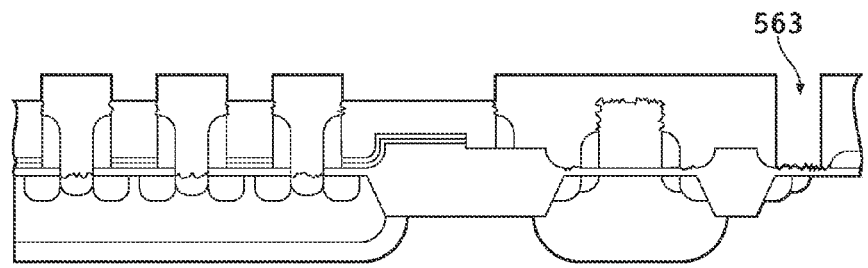
FIG. 10D is a schematic cross-sectional view of the cell subsequent to the process shown in FIG. 10C.

FIG. 10D is a schematic cross-sectional view of the core region and the peripheral circuit region subsequent to the process shown in FIG. 10C. A contact hole 563 may be in the peripheral circuit region 502 as necessary. Here, in this drawing, only contact hole 563 extending toward the soured/drain (S/D) is shown. The contact is also opened toward the polysilicon directly extending from the gate electrode. Specifically, resist is used as a mask for dry etching to obtain the above-mentioned structure.

Figure 10E:
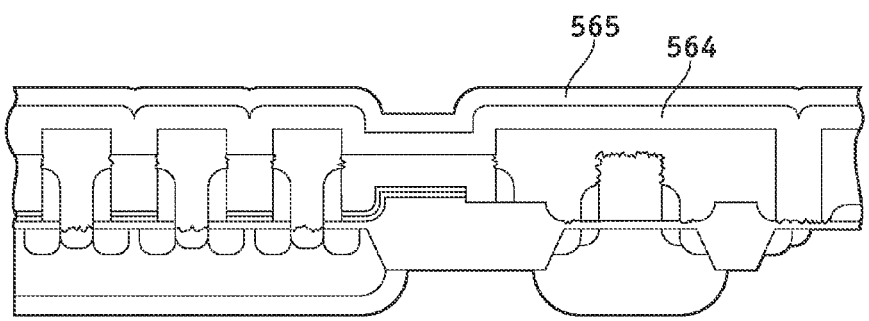
FIG. 10E is a schematic cross-sectional view of the cell subsequent to the process shown in FIG. 10D.

FIG. 10E is a schematic cross-sectional view of the core region and the peripheral circuit region subsequent to the process shown in FIG. 10D. A wiring material 564 and a cap film 565 arranged thereon are deposited on the entire wafer. The wiring material 564 is buried in an upper region and inside the contact hole 563 in the peripheral circuit region 502. More particularly, tungsten or tungsten silicide is deposited as the wiring material 564 by CVD, and the silicon nitride film is deposited as the cap film 565 by CVD.

Figure 11A:
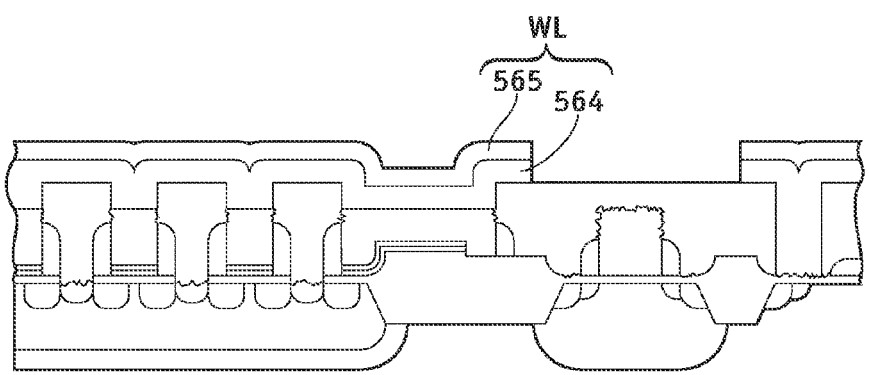
FIGS. 11A and 11B are schematic cross-sectional views illustrating a portion of the word line having peripheral wiring thereon and another portion of the word line not having peripheral wiring arranged thereon subsequent to the process shown in FIG. 10E.
Figure 11B:
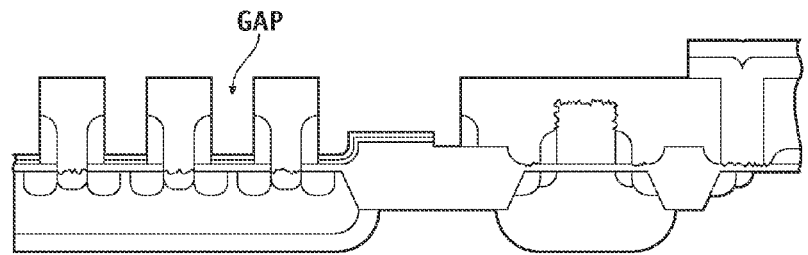

FIGS. 11A and 11B are schematic cross-sectional views of the word line and peripheral wiring provided thereon and the word line and a region of the peripheral wiring that is not provided on the word line, in the process subsequent to the process shown in FIG. 10E.

Figure 12:
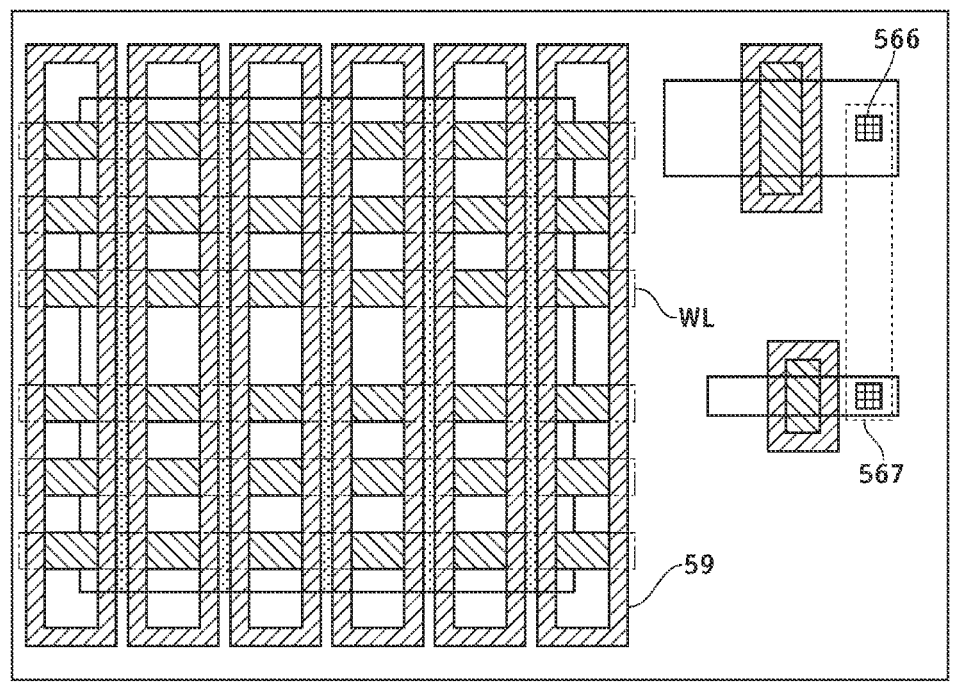
FIG. 12 is a view illustrating the process of the third embodiment for forming a SONOS type multi-level cell architecture having buried bit lines, and is a schematic top view of a die having the peripheral wiring shown in FIGS. 11A and 11B.

FIG. 12 is a schematic top view of the die having the peripheral wiring shown in FIGS. 11A and 11B. Focusing on the core region 501, as shown in FIG. 11A, the word line WL composed of the cap film 565 and the wiring material 564 is formed in a direction perpendicular to the bit lines BL (in a row direction). As shown in FIG. 11B, the gate electrode material provided between the adjacent word lines WL is removed and gaps are formed. Here, the storage film 522 is configured to remain in the ONO film provided on the bottom of the gap. Even if the contact hole is misaligned in the core region 501, the silicon oxide film, the sidewall of the silicon nitride film, and the storage film in the ONO film provided outside the bit line can be used as etch stop films. Therefore, short circuits do not occur between the core plug and the bit line BL Here, referring to FIG. 12, the wiring material 564 is buried in the contact hole 563 to form a peripheral plug 566. Peripheral wiring 567 is formed by patterning the wiring material 564. To be more precise, the resist is appropriately patterned and dry etched to form the word line WL in the core region 501 and the peripheral wiring 567 in the peripheral circuit region. Here, the cap film 565, the wiring material 564, and the gate electrode material are selectively etched.

Figure 13A:
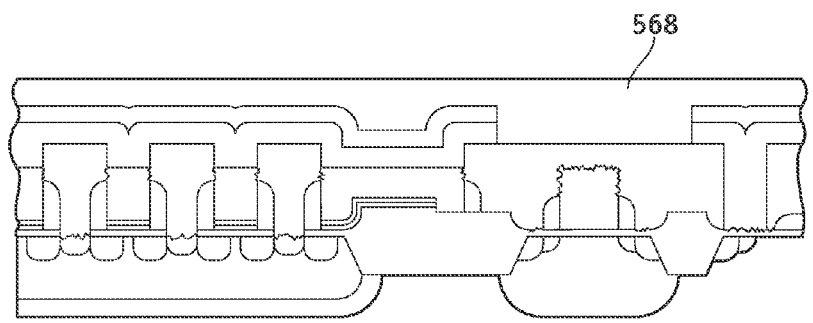
FIGS. 13A and 13B are views illustrating the process of the third embodiment for forming a SONOS type multi-level cell architecture with a buried bit line structure, and are schematic cross-sectional views of the cell subsequent to the process shown in FIGS. 11A and 11B.
Figure 13B:
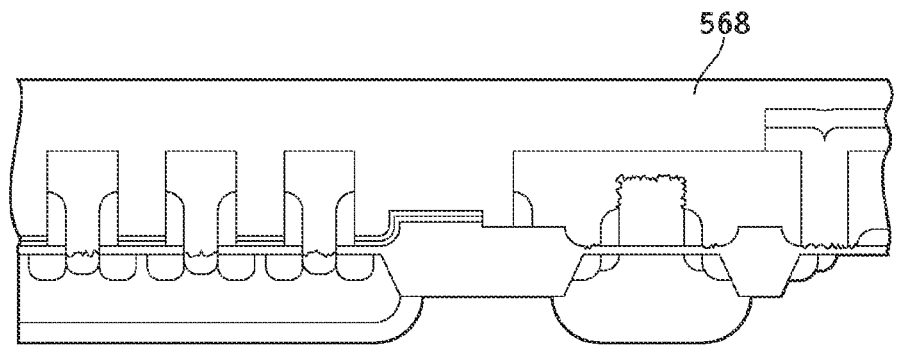

FIGS. 13A and 13B are schematic cross-sectional views of the core region and the peripheral circuit region subsequent to the process shown in FIGS. 11A and 11B. A gap fill film 568 is deposited on the entire wafer and the surface is planarized. The silicon oxide film is deposited as the gap fill film 568 by a CVD process such as PSG, TEOS, or HDP, and is polished by CMP to obtain the aforementioned structure.

Figure 14A:
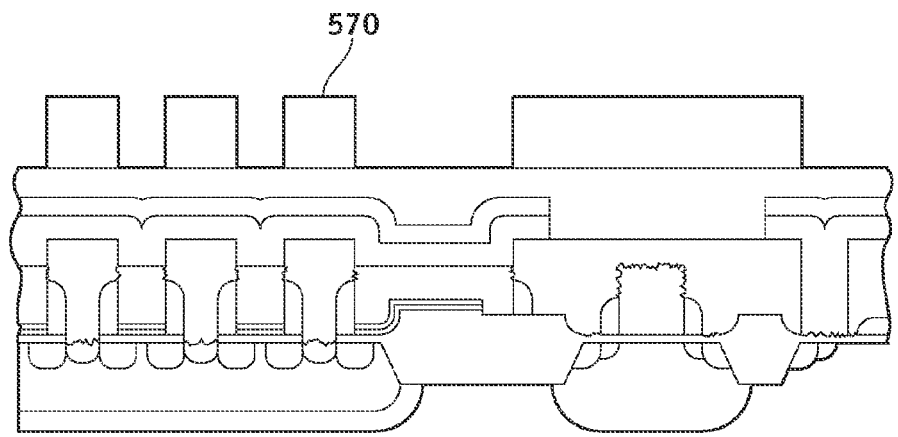
FIGS. 14A and 14B are views illustrating the process of the third embodiment for forming a SONOS type multi-level cell architecture having buried bit lines, and are schematic cross-sectional views of the cell subsequent to the process shown in FIGS. 13A and 13B.
Figure 14B:
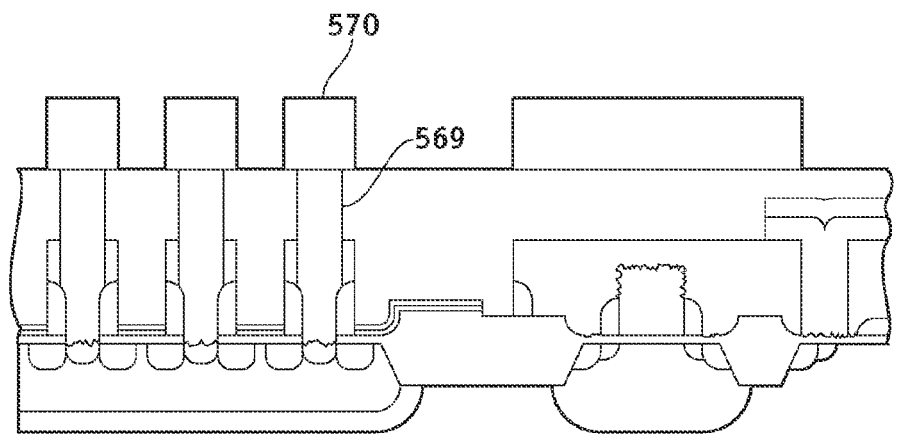
Figure 15:
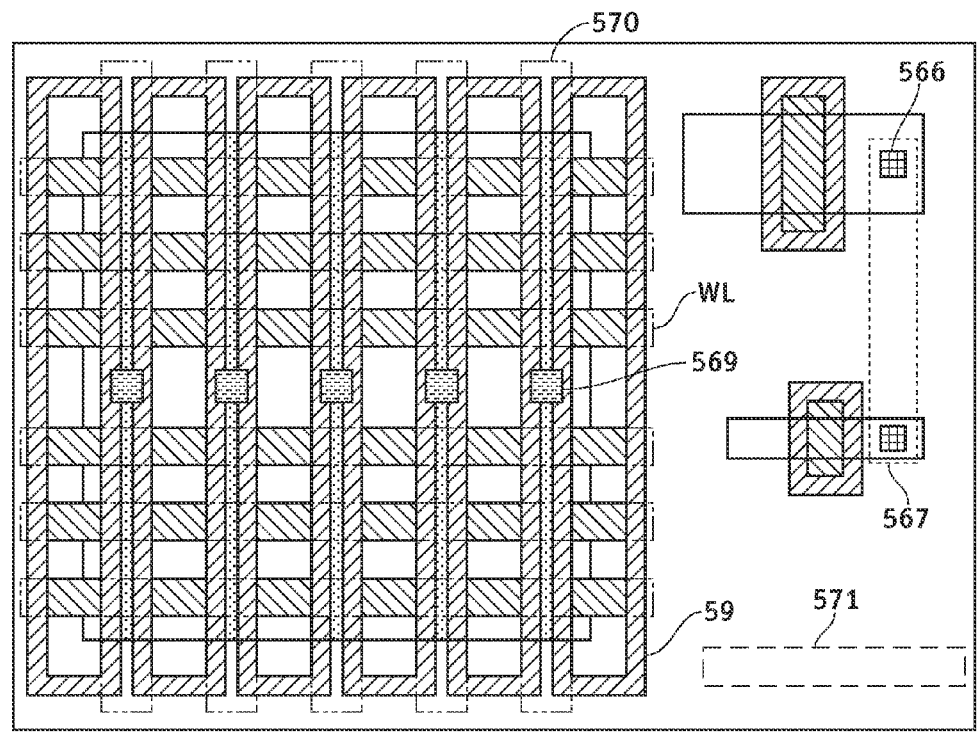
FIG. 15 is a view illustrating the process of the third embodiment for forming the SONOS type multi-level cell architecture having buried bit lines, and is a schematic top view of the die.

FIGS. 14A and 14B are schematic cross-sectional views of the core region and the peripheral circuit region subsequent to the process shown in FIGS. 13A and 13B. FIG. 15 is a schematic top view of the die in this state. As shown in these drawings, core plugs 569 and core wirings 570 are provided in the core region 501, and a peripheral wiring 571 is provided in the second layer of the peripheral circuit region 502.

Figure 16:
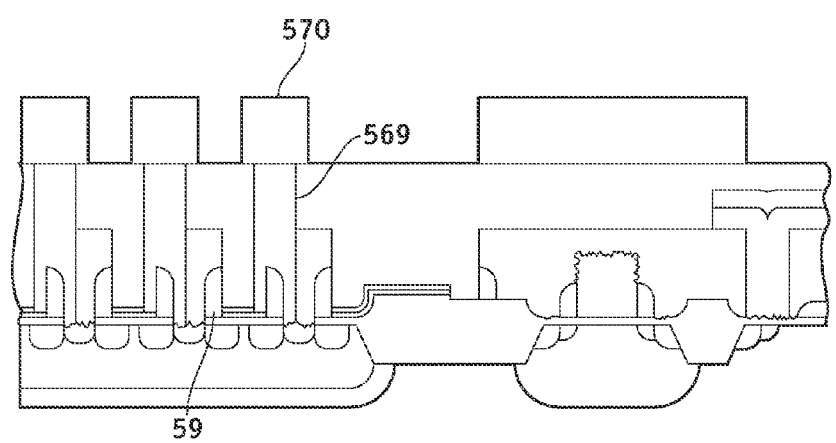
FIG. 16 is a view illustrating the process of the third embodiment for forming a SONOS type multi-level cell architecture with the buried bit lines, and shows the misalignment of the contact holes provided in a core region.

As shown in FIG. 16, even if the contact hole provided in the core region 501 is misaligned, the silicon oxide film, the sidewall of the silicon nitride film, and the storage film included in the ONO film, arranged outside of the bit line, can be used as an etch stop film. Therefore, short circuits do not occur between the core plug and the outside of the bit line BL. The above-described architecture can be manufactured using well-known methods. In the end, a specific wiring and an interlayer insulating film are formed using well known methods, and the semiconductor device fabrication is completed.

There has been described a method embodying the present invention using an example of SONOS type cell architecture having buried bit lines, in which the bit lines are formed by ion implantation by using the sidewalls of $Si_3N_4$. The aforementioned bit line fabrication is applicable to the architecture of a floating-gate memory having a buried bit line.

According to the above-described method, if the contact hole is misaligned with respect to the outside of the sidewall, it is possible to fabricate the contact hole so as to be in contact only with the opening of the sidewall by using a nitride film included in the ONO film as an etch stop film. In addition, before impurities are implanted into the bit lines, it is possible to form at least the ONO film and the gate insulating film in the periphery circuit and oxidize the side wall of the gate electrode. Furthermore, it is possible to deposit the sidewall and activate at least the LDD in the periphery region and the implanted ions in the source/drain. It is therefore possible to suppress extension of the impurity diffusion in the bit line in the lateral direction, as compared to conventional methods, and to reduce the bit line resistivity by the above-described siliciding as well. Moreover, the channel direction edges of the ONO film are aligned with the junction of the bit lines (or to provide the offset). This makes it possible to limit the erase position, thereby preventing the unbalanced write and erase positions.

Fourth Embodiment

In the fourth embodiment, a description will be given of a SONOS type memory architecture having buried bit lines, in which the bit line is formed in a self-aligned manner by combining the method of forming the bit line of a diffusion layer in the trench groove by ion implantation as described in the first and second embodiments, and the method of forming bit lines by implanting ions into the sidewalls of $Si_3N_4$ as described in the third embodiment.

Figure 17:
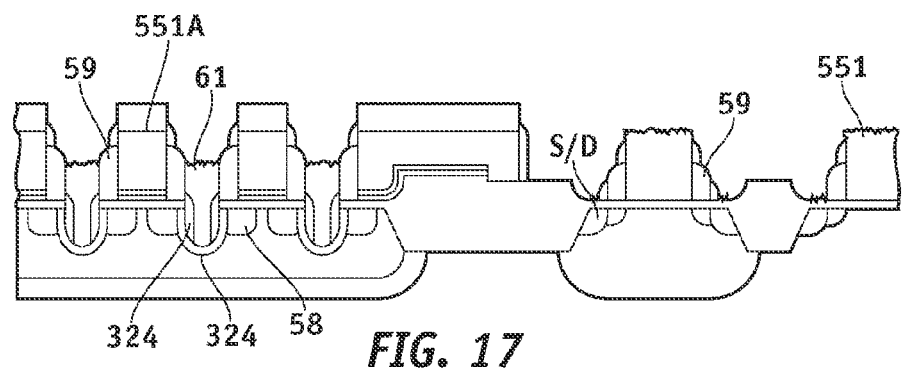
FIG. 17 corresponds to the fabrication process of the third embodiment shown in FIG. 10A.

FIG. 17 corresponds to the fabrication process shown in FIG. 10A in the third embodiment. That is to say, according to the present embodiment, subsequent to the process in FIG. 8A, bit lines BL as shown in FIG. 8D are not formed. Instead, the trench groove is arranged between the core pockets 58 to form a bit line implant layer 324 on the inner surface of the groove, and then the conductive film 320 of polysilicon, for example, is buried on the inner surface of the groove, as described in the first and second embodiments. Reference numeral 60 represents sidewalls of the buried bit lines, and reference numeral 61 represents polysilicon buried in the bit line groove. The fabrication process of the cell is basically the same as that of the third embodiment except for the bit line forming process. Therefore, only the bit line forming process will be described hereinafter.

Figure 18A:
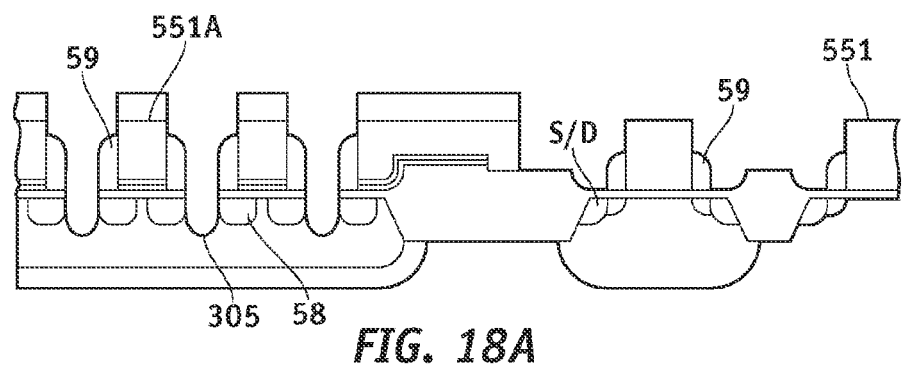
FIGS. 18A through 18E are views illustrating the process of forming the structure shown in FIG. 17.
Figure 18B:
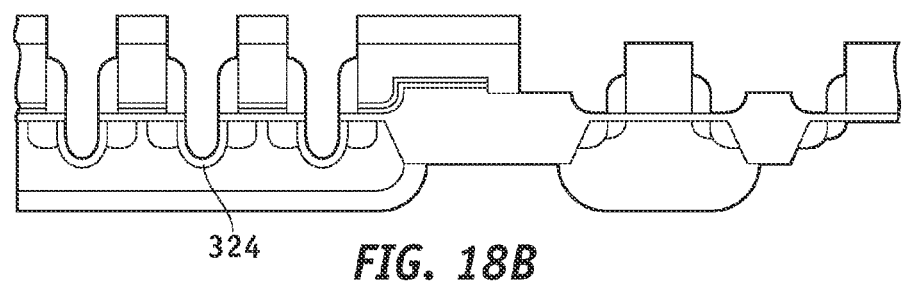
Figure 18C:
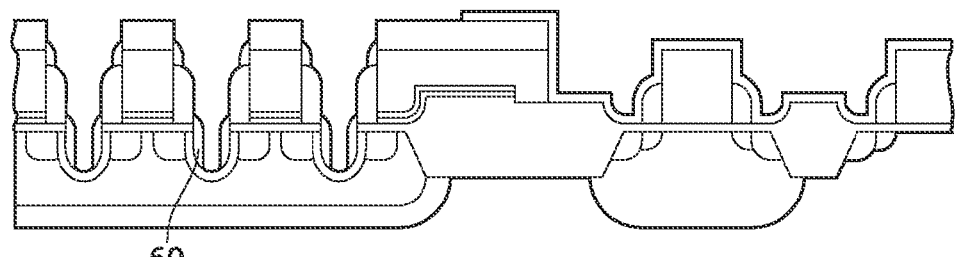

FIGS. 18A through 18E are views illustrating a process of fabricating the structure shown in FIG. 17. Firstly, as shown in FIG. 18A, etching is carried out so as to form the bit line groove (shallow trench groove) 305 for forming bit lines between the gate electrode lower portions 551a having the sidewalls 59 of $Si_3N_4$. A first ion implantation is carried out for forming the bit lines on the inner walls and the bottoms of the groves 305 using the sidewalls 59 of $Si_3N_4$ for the mask (FIG. 18B). Next, the bit line sidewalls 60 of $SiO_2$ are formed on the side wall surfaces of the bit line grooves 324 (FIG. 18C). Here, the material of the sidewalls remains entirely in the periphery region by means of resist patterning.

Figure 18D:
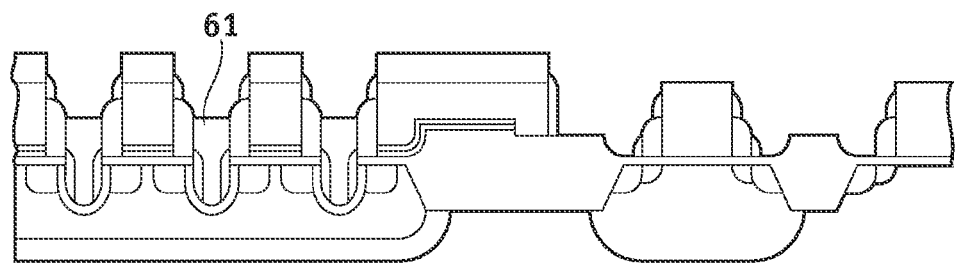

Subsequently, a second ion implantation is carried out on the bottoms of the bit line grooves 324 using the bit line sidewalls 60 of $SiO_2$ as a mask, and then polysilicon 61 is deposited and etched back (FIG. 18D). The polysilicon remains only in the bit line groove and the entire surface of polysilicon is removed in the peripheral circuit region. Moreover, the core region is covered with the resist, and only the sidewalls in the peripheral circuit region are etched back so as to expose the top regions of the gate electrodes in the peripheral circuit region and the surfaces of the source/drain.

Figure 18E:
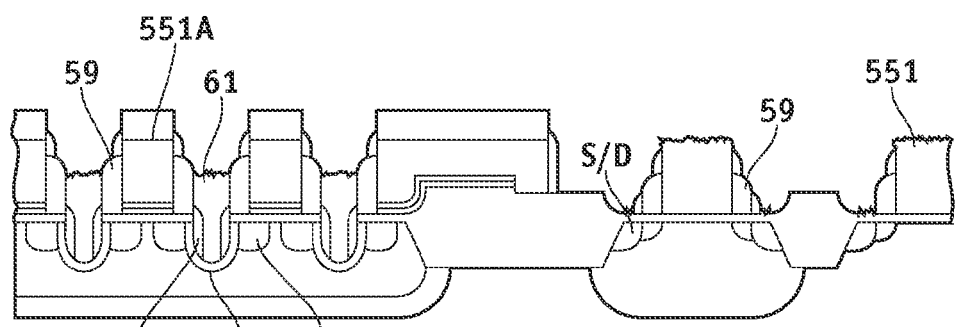

Also, silicided regions (shown as wavy lines in the drawings) are the surface of the polysilicon 61 buried in the bit line groove 305 in the core region, the exposed surface of the source/drain (S/D) formed in the peripheral circuit region, and the side wall surface and the top surface that are exposed without being covered with the sidewall 59 on the side wall of the gate electrode 551 (FIG. 18E). In this manner, the structure shown in FIG. 17 is obtainable.

In accordance with the present embodiment, the SONOS type memory architecture, in which the bit lines are formed in a self-aligned manner, is accomplished by combining the method of forming the bit line of diffusion layer in the trench groove by ion implantation and the method of forming bit lines by providing the sidewall of $Si_3N_4$ and implanting ions thereinto. It is therefore possible to obtain stable electric characteristics by forming the bit line of the diffusion layer in the shallow trench without enlarging the cell area, and in addition, it is possible to obtain an architecture in which the memory cell can be downsized. Short circuits do not occur between bit lines due to a misaligned contact.

The present invention provides a SONOS type memory architecture having buried bit lines, in which the bit line is formed in the shallow trench and the stable electric characteristics are obtainable without enlarging the cell area. In addition, the present invention provides for a fabrication method suitable for downsizing the non-volatile memory having buried bit lines, and also provides an architecture in which a short circuit seldom occurs between the bit lines because of a misaligned contact.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor device comprising:
    a buried bit line structure having a groove in which a bit line is buried;
    a conductive layer on an inner surface of the groove; and
    an insulation film in contact with the conductive layer, the insulation film provided only along a side wall surface of the groove.

2. The semiconductor device as claimed in claim 1, wherein the conductive layer comprises an impurity-diffusion layer.

3. The semiconductor device as claimed in claim 2, wherein the impurity-diffusion layer is an impurity implantation layer.

4. The semiconductor device as claimed in claim 1, wherein the groove is a trench formed on a main surface of a substrate.

5. The semiconductor device as claimed in claim 2, wherein the impurity-diffusion layer has a portion that is located on a side wall of the groove has an impurity concentration lower than that of another portion of the impurity-diffusion layer located on a bottom of the groove.

6. The semiconductor device as claimed in claim 2, further comprising the insulation film provided on a portion of the impurity-diffusion layer on a side wall of the groove.

7. The semiconductor device as claimed in claim 2, further comprising a silicide film of a refractory metal provided on a portion of the impurity-diffusion layer provided on the bottom of the groove.

8. The semiconductor device as claimed in claim 7, wherein the refractory metal comprises one of Ti and Co.

9. A semiconductor device comprising:
    a buried bit line structure having a groove in which a bit line is buried;
    a first conductive film provided only in and along an inner side wall surface of the groove, wherein the first conductive film is provided only within the groove; and
    a second conductive film provided on and in contact with the first conductive film to fill a remaining portion of the groove.

10. The semiconductor device as claimed in claim 9, wherein the bit line comprises an impurity-diffusion layer.

11. The semiconductor device as claimed in claim 10, wherein the impurity-diffusion layer is an impurity implantation layer.

12. The semiconductor device as claimed in claim 9, wherein the groove is a trench formed on a main surface of a substrate.

* * * * *